(12) United States Patent
Takemura

(10) Patent No.: US 8,854,867 B2
(45) Date of Patent: Oct. 7, 2014

(54) MEMORY DEVICE AND DRIVING METHOD OF THE MEMORY DEVICE

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 254 days.

(21) Appl. No.: 13/442,113

(22) Filed: Apr. 9, 2012

(65) Prior Publication Data
US 2012/0262982 A1  Oct. 18, 2012

(30) Foreign Application Priority Data
Apr. 13, 2011 (JP) ................. 2011-088815

(51) Int. Cl.
*G11C 7/00* (2006.01)
*G11C 11/412* (2006.01)
(52) U.S. Cl.
CPC .................. *G11C 11/412* (2013.01)
USPC ........... 365/154; 365/149; 365/189.05
(58) Field of Classification Search
CPC ... G11C 11/412; G11C 11/413; G11C 11/419
USPC .............. 365/154, 149, 49, 189.05
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,966,000 B2* | 11/2005 | Zhang et al. | 726/22 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Dinh
(74) *Attorney, Agent, or Firm* — Fish & Richardson P.C.

(57) ABSTRACT

A memory device which can reduce power consumption and a driving method thereof are disclosed. In a memory element including an inverter and the like, a capacitor for holding data and a capacitor switching element for controlling store and release of charge in the capacitor are provided. The capacitor switching element is designed so that the off-state current is sufficiently low. Therefore, even when power supply of the inverter is stopped after charge corresponding to data is stored in the capacitor, data can be held for a long period of time. In order to return data, potentials of output and input terminals of the inverter are set to a precharge potential, then charge in the capacitor is released, and power is supplied to the inverter. A switching element for supplying the precharge potential may be provided.

20 Claims, 15 Drawing Sheets

(56) References Cited

U.S. PATENT DOCUMENTS

| | | | |
|---|---|---|---|
| 7,211,825 B2 | 5/2007 | Shih et al | |
| 7,269,077 B2 * | 9/2007 | Chiu et al. | 365/189.05 |
| 7,282,782 B2 | 10/2007 | Hoffman et al. | |
| 7,297,977 B2 | 11/2007 | Hoffman et al. | |
| 7,304,883 B2 * | 12/2007 | Sumita | 365/154 |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,772,053 B2 | 8/2010 | Kameshiro et al. | |
| 7,995,009 B2 * | 8/2011 | Umezaki | 345/76 |
| 8,410,838 B2 | 4/2013 | Kato et al. | |
| 8,421,068 B2 | 4/2013 | Yamazaki et al. | |
| 8,421,069 B2 | 4/2013 | Yamazaki et al. | |
| 8,471,620 B2 | 6/2013 | Koyama et al. | |
| 8,472,235 B2 | 6/2013 | Kozuma et al. | |
| 8,501,564 B2 | 8/2013 | Suzawa et al. | |
| 8,547,771 B2 | 10/2013 | Koyama | |
| 8,575,985 B2 | 11/2013 | Ohmaru et al. | |
| 8,593,856 B2 | 11/2013 | Koyama et al. | |
| 8,630,130 B2 | 1/2014 | Kurokawa | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0057190 A1 | 3/2011 | Kimura et al. | |
| 2011/0089419 A1 | 4/2011 | Yamazaki et al. | |
| 2011/0176357 A1 | 7/2011 | Koyama et al. | |
| 2011/0187410 A1 | 8/2011 | Kato et al. | |
| 2011/0193078 A1 | 8/2011 | Takemura | |
| 2012/0032730 A1 | 2/2012 | Koyama | |
| 2012/0051117 A1 | 3/2012 | Yamazaki et al. | |
| 2012/0112257 A1 | 5/2012 | Kato | |
| 2012/0212995 A1 | 8/2012 | Kurokawa | |
| 2012/0230138 A1 | 9/2012 | Endo | |
| 2012/0243340 A1 | 9/2012 | Kobayashi et al. | |
| 2012/0250397 A1 | 10/2012 | Ohmaru | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| WO | 2004/114391 A1 | 12/2004 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, A. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologus Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308

Nomura, K et al., "Room-Temperature Fabrication of Transparent Flexible Thin-Film Transistors Using Amorphous Oxide Semiconductors," Nature, Nov. 25, 2004, vol. 432, pp. 488-492

Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m(m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

MEMORY DEVICE AND DRIVING METHOD OF THE MEMORY DEVICE

BACKGROUND OF THE INVENTION

1. Field of the Invention

The present invention relates to a memory device including a semiconductor device and to a semiconductor integrated circuit, such as a signal processing circuit, including the memory device.

2. Description of the Related Art

Until now, a transistor including amorphous silicon, polysilicon, or microcrystalline silicon has been used for a display device such as a liquid crystal display. A technique in which such a transistor is utilized for a semiconductor integrated circuit has been proposed (e.g., see Patent Document 1).

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon.

A metal oxide is used for various applications. For example, indium oxide is a well-known metal oxide and used as a material of a transparent electrode included in a liquid crystal display device or the like. Examples of the metal oxide having semiconductor characteristics include tungsten oxide, tin oxide, indium oxide, and zinc oxide. Transistors in which a channel formation region is formed using such a metal oxide having semiconductor characteristics are already known (see Patent Documents 2 to 4).

REFERENCE

Patent Document

[Patent Document 1] U.S. Pat. No. 7,772,053
[Patent Document 2] United States Published Patent Application No. 2007/0072439
[Patent Document 3] United States Patent Application Publication No. 2011/0193078
[Patent Document 4] United States Patent Application Publication No. 2011/0176357

SUMMARY OF THE INVENTION

A signal processing circuit such as a central processing unit (CPU) has a variety of configurations depending on its application but is generally provided with various semiconductor memory devices (hereinafter simply referred to as memory devices) such as a register and a cache memory as well as a main memory for storing data or a program. A register has a function of temporarily holding data for carrying out arithmetic processing, holding a program execution state, or the like. In addition, a cache memory is provided in a CPU so as to be located between an arithmetic unit and a main memory in order to reduce low-speed access to the main memory and speed up the arithmetic processing.

In a memory device such as a register or a cache memory, writing of data needs to be performed at higher speed than in a main memory. Therefore, in general, a flip-flop is used as a register and an SRAM or the like is used as a cache memory.

In FIG. 2A, a memory element which constitutes a register is illustrated. A memory element 200 illustrated in FIG. 2A includes an inverter 201, an inverter 202, a switching element 203, and a switching element 204. Input of a signal IN to an input terminal of the inverter 201 is controlled by the switching element 203. A potential of an output terminal of the inverter 201 is supplied to a circuit of a subsequent stage as a signal OUT. The output terminal of the inverter 201 is connected to an input terminal of the inverter 202, and an output terminal of the inverter 202 is connected to the input terminal of the inverter 201 via the switching element 204.

When the switching element 203 is turned off and the switching element 204 is turned on, a potential of the signal IN which is input via the switching element 203 is held in the memory element 200.

FIG. 2B illustrates another memory element as an example. A memory element 220 illustrated in FIG. 2B includes an inverter 201, an inverter 202, a switching element 203, and a switching element 204. Input of a signal IN to an input terminal of the inverter 201 is controlled by the switching element 203. An output terminal of the inverter 201 is connected to an input terminal of the inverter 202, and an output terminal of the inverter 202 is connected to the input terminal of the inverter 201 via the switching element 204. A potential of the output terminal of the inverter 202 is supplied to a circuit of a subsequent stage as a signal OUT.

When the switching element 203 is turned off and the switching element 204 is turned on, a potential of the signal IN which is input via the switching element 203 is held in the memory element 220.

FIG. 2C illustrates the specific circuit configuration of the memory element 200 illustrated in FIG. 2A. The memory element 200 illustrated in FIG. 2C includes the inverter 201, the inverter 202, the switching element 203, and the switching element 204. The connection structure of these circuit elements is the same as that in FIG. 2A.

The inverter 201 includes a p-channel transistor 207 and an n-channel transistor 208 whose gate electrodes are connected to each other. In addition, the p-channel transistor 207 and the n-channel transistor 208 are connected in series between a node to which a high-level potential VDD is supplied and a node to which a low-level potential VSS is supplied.

In a similar manner, the inverter 202 includes a p-channel transistor 209 and an n-channel transistor 210 whose gate electrodes are connected to each other. In addition, the p-channel transistor 209 and the n-channel transistor 210 are connected in series between a node to which the high-level potential VDD is supplied and a node to which the low-level potential VSS is supplied.

The inverter 201 illustrated in FIG. 2C operates such that one of the p-channel transistor 207 and the n-channel transistor 208 is turned on and the other is turned off according to the level of potentials supplied to the gate electrodes thereof. Thus, current between the node to which the potential VDD is supplied and the node to which the potential VSS is supplied should be ideally zero.

However, actually a minute amount of off-state current flows in the off-state transistor; therefore, the current between the nodes can not be zero. A similar phenomenon also occurs in the inverter 202. Therefore, power is consumed in the memory element 200 even in a state where data is just being held.

In the case of an inverter manufactured using bulk silicon, although it depends on the size of a transistor, an off-state current of about 0.1 pA is generated at room temperature at a voltage between the nodes of about 1 V, for example. The memory element illustrated in FIGS. 2A to 2C includes two inverters: the inverter 201 and the inverter 202; therefore, an off-state current of about 0.2 pA is generated. In the case of a register including about $10^7$ memory elements, the off-state current in the whole register is 2 μA.

Further, as miniaturization proceeds, the thickness of a gate insulator also becomes small, so that gate current (gate leakage current) flowing between a gate and a channel through the gate insulator becomes too large to ignore.

In addition, there has been an attempt to reduce the threshold voltage of a transistor in order to compensate a decrease in speed due to a decrease in power supply voltage; as a result, off-state current per inverter is increased by approximately three orders in magnitude in some cases.

According to the above, the power consumption of the register is increased against a decrease in a line width of a circuit. Furthermore, heat generated by consuming power causes an increase in temperature of the IC chip, and then power consumption is further increased, which results in a vicious circle Like the register, an SRAM also includes an inverter, and thus power is consumed due to the off-state current of a transistor. As described above, as in the case of the register, power is consumed in a cache memory including the SRAM even in a state where writing of data is not performed.

In order to suppress power consumption, a method for temporarily stopping the supply of a potential to a memory device in a period during which data is not input and output has been suggested. A volatile memory device in which data is erased when the supply of a potential is stopped is used for a register and a cache memory. Therefore, in the method, a nonvolatile memory device is provided around the volatile memory device and the data is temporarily transferred to the nonvolatile memory device. However, since such a nonvolatile memory device is mainly formed using a magnetic element or a ferroelectric, the manufacturing process is complex.

In addition, in the case where the power supply is stopped for a long time in a CPU, data in a memory device is transferred to an external memory device such as a hard disk or a flash memory before the power supply is stopped, so that the data can be prevented from being erased. However, it takes time to place the data back in a register, a cache memory, and a main memory from such an external memory device. Therefore, back up of data using the external memory device such as a hard disk or a flash memory is not suitable for the case where the power supply is stopped for a short time (e.g., for 100 microseconds to one minute) for reducing power consumption.

In view of the above-described problems, it is an object of one embodiment of the present invention to provide a memory device and a signal processing circuit for which a complex manufacturing process is not necessary and whose power consumption can be suppressed and a method for driving the memory device, and a method for driving the signal processing circuit. In particular, it is an object to provide a memory device and a signal processing circuit whose power consumption can be suppressed by stopping the power supply for a short time and a method for driving the memory device, and a method for driving the signal processing circuit.

In a memory element including a logic element by which the phase of an input signal is inverted and the signal is output (hereinafter, the logic element is referred to as a phase-inversion element) such as an inverter or a clocked inverter, a capacitor which holds data and a capacitor switching element which controls storing and releasing of electric charge in the capacitor are provided.

As the capacitor switching element, a transistor in which one or more of amorphous silicon, polysilicon, microcrystalline silicon, and a compound semiconductor (preferably wide bandgap compound semiconductor) such as an oxide semiconductor is included in a channel formation region is used. The above memory element is used for a memory device such as a register, a cache memory, or a main memory in a signal processing circuit. The capacitor switching element is preferably formed above the phase-inversion element and overlaps therewith.

Note that the "wide bandgap compound semiconductor" in this specification refers to a compound semiconductor having a bandgap greater than or equal to 2 eV. Examples of the wide bandgap compound semiconductor other than an oxide semiconductor include sulfide such as zinc sulfide, and nitride such as gallium nitride. In either case, it is preferable that the donor or acceptor concentration be extremely low by high purification.

Further, the capacitor is also preferably formed above the phase-inversion element and overlaps therewith, and may be formed in the same layer as the capacitor switching element or in a different layer from the capacitor switching element. When the capacitor is formed in the same layer as the capacitor switching element, although it is necessary to form a region for the capacitor switching element and a region for the capacitor, the manufacturing process can be simplified. On the other hand, when the capacitor is formed in a different layer from the capacitor switching element, although the number of steps for manufacturing the capacitor is increased, there are advantages that the integration degree is increased, an area used for the capacitor is increased, and the like. Thus, a dielectric of the capacitor can be formed using a different component from a gate insulator of the capacitor switching element; as a result, capacitance can be increased.

The on-state resistance of the capacitor switching element and the capacitance of the capacitor may be determined in accordance with speed of switching operation. The time less than or equal to 100 microseconds is enough for switching operation with the purpose of power down or power return. The time for switching operation may be greater than or equal to 100 milliseconds depending on the intended use. The off-state resistance of the capacitor switching element and the capacitance of the capacitor may be determined depending on intervals of switching operations needed.

Further, the signal processing circuit includes various logic circuits such as an arithmetic circuit which transmits/receives data to/from the memory device in addition to the above memory device. Not only the supply of power supply voltage to the memory device but also the supply of power supply voltage to the arithmetic circuit which transmits/receives data to/from the memory device may be stopped.

According to one embodiment of the present invention, a memory element at least includes two phase-inversion elements (first and second phase-inversion elements), a capacitor, and a capacitor switching element which controls storing and releasing of electric charge in the capacitor. A signal including data that is input to the memory element (an input signal) is input to an input terminal of the first phase-inversion element. An output terminal of the first phase-inversion element is connected to an input terminal of the second phase-inversion element. An output terminal of the second phase-inversion element is connected to the input terminal of the first phase-inversion element. A potential of the output terminal of the first phase-inversion element or the input terminal of the second phase-inversion element is output to a memory element or another circuit of a subsequent stage as an output signal. Alternatively, a potential of the output terminal of the second phase-inversion element is output to a memory element or another circuit of a subsequent stage as an output signal.

Each of the phase-inversion elements has a structure in which at least one p-channel transistor and at least one n-channel transistor whose gate electrodes are connected to each other are connected in series between a first node and a second node.

In order to store data of a signal as needed, which is input to the memory element, the capacitor is connected to a node to which a potential of the signal is supplied, via the capacitor switching element.

In the state where a power supply voltage is applied between the first node and the second node, when the signal including the data is input to the input terminal of the first phase-inversion element, the data is held by the first phase-inversion element and the second phase-inversion element. In the case where the application of the power supply voltage between the first node and the second node is stopped, before the application of the power supply voltage is stopped, the capacitor switching element is turned on and the data of the signal is stored in the capacitor. With the above-described structure, even when the application of the power supply voltage to the phase-inversion elements is stopped, data can be held in the memory element.

A channel formation region of a transistor which is used as the capacitor switching element may include one or more of amorphous silicon, polysilicon, microcrystalline silicon, and a compound semiconductor (e.g., a highly purified oxide semiconductor).

A transistor including a highly purified oxide semiconductor has the characteristic of extremely high off-state resistance. Therefore, charge can be held in a capacitor for a sufficiently long period of time. Even in the case of using a transistor including a semiconductor that is not an oxide semiconductor, needed off-state resistance can be obtained by making the channel length sufficiently large and the channel width sufficiently small.

In order to return data to the phase-inversion elements, first, input terminals and output terminals of two phase-inversion elements in the memory element are each set to an appropriate potential (precharge potential). The precharge potential is determined considering the capacitance of the capacitor, the gate capacitance of the capacitor switching element, parasitic capacitance caused by these elements, and the like.

The precharge potential may be a high-level potential (e.g., VDD), a low-level potential (e.g., VSS), or an intermediate potential therebetween. As an example, the precharge potential may be set to a nearly middle potential of the high-level potential and the low-level potential. In other words, the precharge potential is set so that a difference between the precharge potential and the average of the high-level potential and the low-level potential is smaller than $\frac{1}{5}$ (preferably smaller than $\frac{1}{10}$) of a difference between the high-level potential and the low-level potential.

For example, when the high-level potential is +1 V and the low-level potential is 0 V, the average is +0.5 V. The value of $\frac{1}{5}$ of a difference between the high-level potential and the low-level potential is 0.2 V, and the value of $\frac{1}{10}$ of the difference is 0.1 V. Accordingly, the precharge potential is higher than +0.3 V and lower than +0.7 V, preferably higher than +0.4 V and lower than +0.6V.

As another example, when the high-level potential is +1 V and the low-level potential is −1 V, the average is 0 V, the value of $\frac{1}{5}$ of a difference between the high-level potential and the low-level potential is 0.4 V, and the value of $\frac{1}{10}$ of the difference is 0.2V. Accordingly, the precharge potential is higher than −0.4 V and lower than +0.4 V, preferably higher than −0.2 V and lower than +0.2 V.

Then, the capacitor switching element is turned on so that charge in the capacitor is released to a circuit of a phase-inversion element. As a result, the potential of an input terminal of the phase-inversion element which is connected to the capacitor switching element varies in accordance with charge in the capacitor. On the other hand, the potential of an input terminal of the phase-inversion element which is not connected to the capacitor switching element hardly varies.

After that, when power is supplied to the phase-inversion elements, a potential corresponding to the potential of the input terminal of one of the phase-inversion elements is input to the other of the phase-inversion elements, and a potential corresponding to the potential of the input terminal of the other of the phase-inversion elements is input to the one of the phase-inversion elements. The potential of the input terminal of the phase-inversion element which is high when the capacitor switching element is turned on is further increased, and the potential of the input terminal of the phase-inversion element which is low when the capacitor switching element is turned on is further decreased. Finally, the potentials of the input terminals are stabilized at a high-level potential and a low-level potential, respectively. This state is the same as the state of the phase-inversion element before the power supply is stopped. That is, data can be restored.

In order to execute the above operation, a circuit for generating the precharge potential and a unit or circuit for supplying the precharge potential to the memory element may be provided in addition to the memory element. In the case of providing the unit or circuit for supplying the precharge potential to the memory element, a switching element is preferably provided in the memory element, for example.

Further, a circuit(s) for supplying potentials to the phase-inversion element is required to supply not only two power supply potentials (VDD and VSS) but also the precharge potential, that is, the circuit(s) needs to supply three or more levels of potential. Therefore, it is preferable that the circuit(s) for supplying potential to the phase-inversion element can supply a variable potential. These potentials may be supplied from the outside.

Note that in a transistor used in the phase-inversion elements, a semiconductor other than an oxide semiconductor, for example, an amorphous, microcrystalline, polycrystalline, or single crystal semiconductor can be used. As a material of such a semiconductor, silicon, gallium arsenide, gallium phosphide, germanium, or the like can be given. The transistor may be manufactured with use of a thin semiconductor film or a bulk semiconductor wafer.

As an oxide semiconductor, an In—Sn—Ga—Zn-based oxide semiconductor which is a four-component metal oxide; an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor which are three-component metal oxides; an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor; or an In—Ga-based oxide semiconductor which are two-component metal oxides; or an In-based oxide semiconductor, a Sn-based oxide semiconductor, or a Zn-based oxide semiconductor which are single-component metal oxides can be used.

In this specification, for example, the term "In—Sn—Ga—Zn-based oxide semiconductor" means a metal oxide containing indium (In), tin (Sn), gallium (Ga), and zinc (Zn) and may have any stoichiometric ratio. The above oxide semiconductor may contain silicon, sulfur, nitrogen, or the like.

Alternatively, oxide semiconductors which can be represented by the chemical formula, $InMO_3(ZnO)_m$ (m>0) can be used. Here, M denotes one or more metal elements selected from Ga, Al, Mn, and Co.

The oxide semiconductor is metal oxide having a relatively high mobility (greater than or equal to 1 $cm^2$/Vs, preferably greater than or equal to 10 $cm^2$/Vs) as a semiconductor characteristic. In addition, an oxide semiconductor which is highly purified (a purified OS) by reduction of an impurity serving as an electron donor (donor), such as moisture or hydrogen, is an i-type semiconductor (intrinsic semiconductor; in this specification, a semiconductor having a carrier concentration of $1\times10^{12}/cm^3$ or lower is called i-type semiconductor) or a semiconductor extremely close to an i-type semiconductor (a substantially i-type semiconductor).

Specifically, impurities such as moisture or hydrogen included in the oxide semiconductor are removed so that the value of the hydrogen concentration in the oxide semiconductor measured by secondary ion mass spectrometry (SIMS) can be less than or equal to $5\times10^{19}/cm^3$, preferably less than or equal to $5\times10^{18}/cm^3$, further preferably less than or equal to $5\times10^{17}/cm^3$, still further preferably less than or equal to $1\times10^{16}/cm^3$.

With the above-described structure, the carrier density of an oxide semiconductor film, which can be measured by Hall effect measurement, can be less than $1\times10^{14}/cm^3$, preferably less than $1\times10^{12}/cm^3$, further preferably less than $1\times10^{11}/cm^3$ that is a value less than or equal to measurement limit. That is, the carrier density of the oxide semiconductor film can be extremely close to zero.

Further, the bandgap of the used oxide semiconductor is greater than or equal to 2 eV and less than or equal to 4 eV, preferably greater than or equal to 2.5 eV and less than or equal to 4 eV, further preferably greater than or equal to 3 eV and less than or equal to 4 eV. By using a highly purified oxide semiconductor film with the wide bandgap as described and sufficiently reduced concentration of impurities such as moisture or hydrogen, the off-state current of the transistor can be reduced.

The analysis of the concentrations of hydrogen in the oxide semiconductor film and a conductive film is described here. Measurements of the hydrogen concentration in the oxide semiconductor film and the hydrogen concentration in the conductive film are performed by SIMS. It is known that it is difficult to obtain accurate data in the proximity of a surface of a sample or in the proximity of an interface between stacked films formed using different materials, by the SIMS in principle.

Thus, in the case where distribution of the hydrogen concentrations in the film in a thickness direction is analyzed by SIMS, an average value in a region of the film in which the value is not greatly changed and substantially the same value can be obtained is employed as the hydrogen concentration.

Further, in the case where the thickness of the film is small, a region where substantially the same value can be obtained cannot be found in some cases due to the influence of the hydrogen concentration in an adjacent film. In that case, the maximum value or the minimum value of the hydrogen concentration in the region of the film is employed as the hydrogen concentration of the film. Furthermore, in the case where a mountain-shaped peak having a maximum value or a valley-shaped peak having a minimum value do not exist in the region of the film, the value at an inflection point is employed as the hydrogen concentration.

Note that it has been found that the oxide semiconductor film formed by sputtering or the like includes a large amount of impurities such as moisture or hydrogen. Moisture and hydrogen easily form a donor level and thus serve as impurities in the oxide semiconductor.

Therefore, in one embodiment of the present invention, in order to reduce impurities such as moisture or hydrogen in the oxide semiconductor film, the oxide semiconductor film is subjected to heat treatment in a reduced pressure atmosphere, an atmosphere of an inert gas such as nitrogen or a rare gas, an oxygen gas atmosphere, or an ultra dry air atmosphere (the moisture amount is less than or equal to 20 ppm (−55° C. by conversion into a dew point), preferably less than or equal to 1 ppm, further preferably less than or equal to 10 ppb, in the case where measurement is performed with use of a dew point meter of a cavity ring down laser spectroscopy (CRDS) system).

The heat treatment is preferably performed at a temperature higher than or equal to 300° C. and lower than or equal to 850° C., further preferably higher than or equal to 550° C. and lower than or equal to 750° C. Note that this heat treatment is performed at a temperature not exceeding the allowable temperature limit of the substrate to be used. An effect of elimination of moisture or hydrogen by the heat treatment has been confirmed by thermal desorption spectrometry (TDS).

A furnace or a rapid thermal annealing method (RTA method) is used for the heat treatment. As the RTA method, a method using a lamp light source or a method in which heat treatment is performed for a short time while a substrate is moved in a heated gas can be employed. By the use of the RTA method, it is also possible to make the time necessary for heat treatment shorter than 0.1 hours.

Specifically, the transistor including the oxide semiconductor film that is highly purified by the above heat treatment as an active layer has an extremely small amount of off-state current (extremely high off-resistance). Specifically, even when an element has a channel width (W) of $1\times10^6$ μm and a channel length (L) of 1 μm, the off-state current (drain current when the voltage between a gate electrode and a source electrode is lower than or equal to 0 V) at a drain voltage (voltage between the source electrode and the drain electrode) of 1 V can be lower than or equal to the measurement limit of a semiconductor parameter analyzer, i.e., less than or equal to $1\times10^{-13}$ A.

In that case, off-state current density (off-state current per channel width of 1 micrometer) is less than or equal to 100 zA/μm. Accordingly, the transistor including the highly purified oxide semiconductor film as an active layer has far lower off-state current than a transistor including silicon having crystallinity.

On the other hand, the off-state current density of a transistor including a thin silicon film can be approximately 100 zA/μm by extremely reducing the silicon film in thickness (see Patent Document 1). Further, sufficiently low off-state current can be obtained by making the transistor to have a long and narrow channel.

By using the transistor having the above structure as a capacitor switching element for controlling release of electric charge stored in the capacitor, leakage of electric charge from the capacitor can be prevented; therefore, even without application of power supply voltage, data is not erased but can be held.

In a period during which data is held in the capacitor, the power supply voltage is not necessarily applied to the phase-inversion elements; as a result, surplus power consumption due to the off-state current of transistors used for the phase-inversion elements can be reduced, and the power consumption of the memory device and further the signal processing circuit including the memory device can be suppressed to be low.

Note that the off-state current of the capacitor switching element is determined depending on the capacitance of the capacitor and a period during which data is held. For example, when a transistor having an off-state current of 1 zA or lower at a drain voltage of 1 V is used as a capacitor switching element and the capacitance of the capacitor is set to 1 fF, data can be held for one or more days.

On the other hand, such a long period of time is not always required for holding data. For example, in the case where it is only necessary to hold data for one second, when the capacitance of the capacitor is 1 fF, the off-state current may be 0.1 fA or lower.

For example, although use of amorphous silicon, polysilicon, microcrystalline silicon, or the like cannot allow achievement of a low off-state current of 1 zA or lower, unlike use of the highly purified oxide semiconductor, a low off-state current of 0.1 fA or lower can be achieved by forming a long and narrow channel or reducing in thickness of a semiconductor layer as described in Patent Document 1.

Note that the off-state current is proportional to the mobility of the semiconductor, so that the lower the mobility becomes, the lower the off-state current becomes. Therefore, a transistor including amorphous silicon has a lower off-state current than a transistor including polysilicon. A transistor including a semiconductor having a low mobility has inferior switching characteristics, but such characteristics hardly adversely affect one embodiment of the present invention. Description thereof will be made later.

By applying the memory element having the above structure to a memory device such as a register or a cache memory included in a signal processing circuit, data in the memory device can be prevented from being erased owing to the stop of the power supply. Further, data can be surely restored by resumption of power supply.

Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

Note that when a transistor including a semiconductor which is not single crystal is used, the semiconductor in this transistor has a lower mobility than single crystal silicon, so that there is a concern that sufficient switching performance cannot be obtained. However, operation such as power down or power return may be slow as compared with the clock speed in the logic circuit. In other words, 100 microseconds or shorter may be sufficient for switching, and 1 millisecond or longer in some situations.

This is because a process in which data held in a flip flop circuit in each memory element is transferred to the capacitor or a process in which data held in the capacitor is transferred to a flip flop circuit in each memory element can be conducted simultaneously in all memory elements. Such a low-speed operation causes no defect in a transistor with a long and narrow channel. The mobility may be 1 cm²/Vs or higher.

In general, relation between on-state current $I_{on}$, off-state current $I_{off}$, time $\tau_{on}$ needed for switching, and time $\tau_{off}$ needed for holding data is represented by the following formula.

$$\frac{\tau_{off}}{\tau_{on}} \sim \frac{I_{on}}{I_{off}} \times \frac{1}{100}$$

Thus, when the on-state current $I_{on}$ is $10^8$ times as large as the off-state current $I_{off}$, $\tau_{off}$ is approximately $10^6$ times as large as $\tau_{on}$. For example, in the case where a time necessary for the capacitor switching element to inject electric charge to the capacitor is one microsecond, the capacitor and the capacitor switching element can hold data for one second. If a period during which data is held is longer than one second, an operation in which the held data is returned to a flip-flop circuit or the like, amplified, and then captured in the capacitor (this operation is called "refresh") may be repeated every second.

Further, in the capacitor, as the capacitance is high, an error at the time of returning data to the flip-flop circuit is less likely to occur. In contrast, when the capacitance is high, the response speed of a circuit including the capacitor and the capacitor switching element is decreased. However, the operation of stop and resuming supply of power may be extremely slow operation as compared with the clock speed of a logic circuit as described above. Thus, there is no problem when the capacitance is less than or equal to 1 pF.

Note that in the case of increasing capacitance as in a DRAM, generally, it is difficult to form a capacitor. However, according to one embodiment of the present invention, a planar capacitor may be employed.

For example, the above circuit such as a register or an SRAM includes a circuit in which two phase-inversion elements (such as inverters) are combined (e.g., flip-flop circuit). The area occupied by the circuit in which two inverters are combined is 50 $F^2$ (F is the minimum feature size) or more, and generally 100 $F^2$ to 150 $F^2$.

Furthermore, when a transistor having a long and narrow channel or a highly purified oxide semiconductor is used as a transistor used for the capacitor switching element, the off-state current of the transistor can be reduced, and influence of the parasitic capacitance formed by wirings can be small. Thus, the capacitance of the capacitor may be much lower than that (about 30 fF) used in a DRAM. Since a capacitor which is smaller than that of DRAM is formed in a region which is larger than the area of DRAM as described above, the capacitor may be a planar capacitor which does not need a special manufacturing method.

Note that when electric charge is drastically transferred from the phase-inversion element to the capacitor, stability of the phase-inversion elements is decreased and accordingly data stored in the phase-inversion element may be corrupted. In such a case, wrong data is held in the capacitor.

In order to prevent the above problem, the on-state current of the capacitor switching element may be reduced to some extent. A transistor with a long and narrow channel or a transistor with a mobility of 10 cm²/Vs or lower, as described above, is suitable for this purpose.

According to one embodiment of the present invention, data can be transferred and held in the capacitor, and supplying power of the phase-inversion element can be stopped. Thus, the threshold value of a transistor used for the phase-inversion element in the memory element may be reduced. That is, a memory element which operates at high speed and consumes less power can be obtained.

DETAILED DESCRIPTION OF THE INVENTION

Figure 1A:
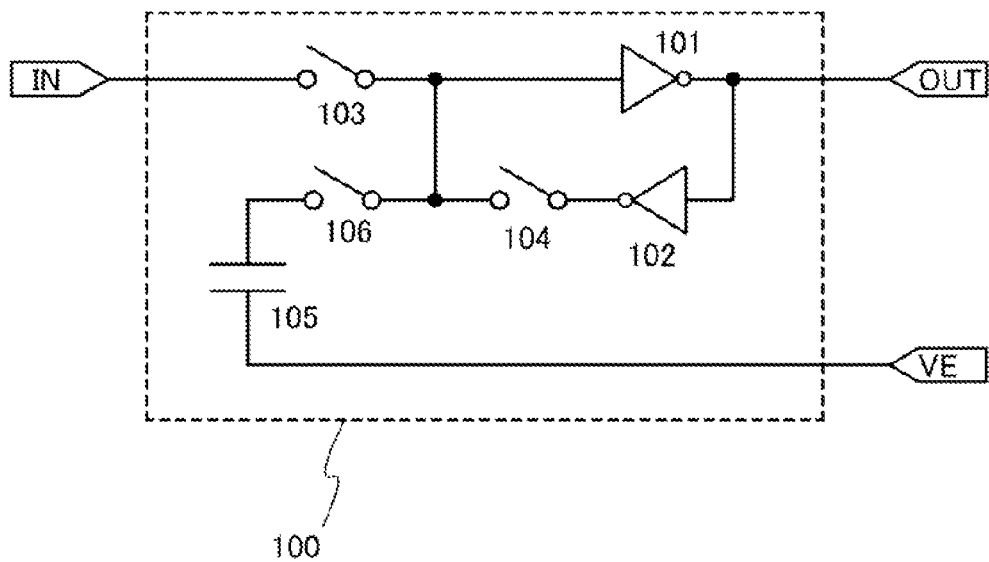
FIGS. 1A and 1B are circuit diagrams of a memory element.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below.

Note that "connection" in this specification means electrical connection and corresponds to the state in which current, voltage, or potential can be supplied, applied, or conducted. Therefore, a state of electrical connection means not only a state of direct connection but also a state of indirect connection through a circuit element such as a wiring, or a resistor, in which current, voltage, or a potential can be supplied or transmitted.

Note also that even when a circuit diagram shows independent components as if they are connected to each other, there is a case in which one conductive film has functions of a plurality of components such as a case in which part of a wiring also functions as an electrode. The term "connection" also means such a case where one conductive film has functions of a plurality of components.

The names of the "source electrode" and the "drain electrode" included in the transistor interchange with each other depending on the polarity of the transistor or the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is supplied is called a drain electrode, and an electrode to which a higher potential is supplied is called a source electrode.

In this specification, although connection relation of the transistor is described assuming that the source electrode and the drain electrode are fixed in some cases for convenience, actually, the names of the source electrode and the drain electrode interchange with each other depending on the relation of the potentials.

Note that in this specification, the state in which the transistors are connected to each other in series means the state in which only one of a source electrode and a drain electrode of a first transistor is connected to only one of a source electrode and a drain electrode of a second transistor. In addition, the state in which the transistors are connected to each other in parallel means the state in which one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

A signal processing circuit of the present invention includes, but is not limited to, in its category an integrated circuit such as a large scale integrated circuit (LSI) including a microprocessor, an image processing circuit, a digital signal processor (DSP), or a microcontroller.

Embodiment 1

A memory device which is one embodiment of the present invention includes one or a plurality of memory elements capable of storing 1-bit data. In FIG. 1A, an example of a circuit diagram of a memory element included in a memory device of the present invention is illustrated. A memory element 100 illustrated in FIG. 1A at least includes a first phase-inversion element 101 and a second phase-inversion element 102 by which the phase of an input signal is inverted and the signal is output, a switching element 103, a switching element 104, a capacitor 105, and a capacitor switching element 106.

A signal IN including data that is input to the memory element 100 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. The potential of the output terminal of the first phase-inversion element 101 or the potential of the input terminal of the second phase-inversion element 102 is output to a memory element of a subsequent stage, and finally output as a signal OUT.

Note that in FIG. 1A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

The capacitor 105 is connected to an input terminal of the memory element 100, i.e., a node to which a potential of the signal IN is supplied, via the switching element 103 and the capacitor switching element 106 so that the data of the signal IN that is input to the memory element 100 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

For the capacitor switching element 106, a transistor including a highly purified oxide semiconductor in a channel formation region is used.

Note that the memory element 100 may further include another circuit element such as a diode, a resistor, an inductor, or a capacitor, as needed.

Figure 1B:
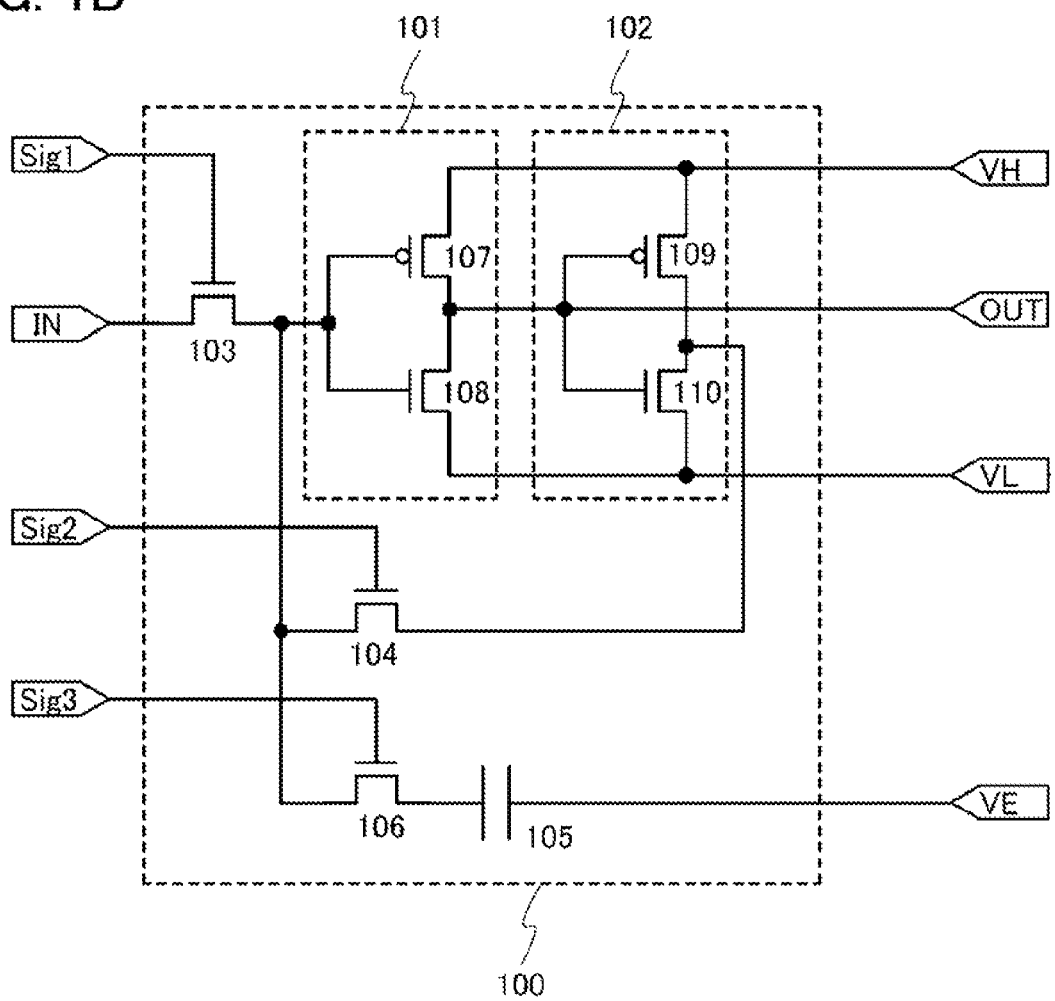

Next, an example of a more specific circuit diagram of the memory element of FIG. 1A is illustrated in FIG. 1B. The memory element 100 illustrated in FIG. 1B includes the first phase-inversion element 101, the second phase-inversion element 102, the switching element 103, the switching element 104, the capacitor 105, and the capacitor switching element 106. The connection structure of these circuit elements are the same as that in FIG. 1A.

The first phase-inversion element 101 in FIG. 1B has a structure in which a p-channel transistor 107 and an n-channel transistor 108 whose gate electrodes are connected to each other are connected in series between a first node to which a potential VH including a high-level potential VDD is supplied and a second node to which a potential VL including a low-level potential VSS is supplied.

Note that in the following embodiments, a node to which potential VH including high-level potential VDD is supplied is referred to as first node, and a node to which potential VL including low-level potential VSS is applied is referred to as second node. In addition, a wiring having the first node is referred to as VH wiring, and a wiring having the second node is referred to as VL wiring.

Specifically, a source electrode of the p-channel transistor 107 is connected to the first node, and a source electrode of the n-channel transistor 108 is connected to the second node. In addition, a drain electrode of the p-channel transistor 107 is connected to a drain electrode of the n-channel transistor 108, and potentials of these two drain electrodes can be regarded as a potential of the output terminal of the first phase-inversion element 101. In addition, potentials of the gate electrode of the p-channel transistor 107 and the gate electrode of the n-channel transistor 108 can be regarded as a potential of the input terminal of the first phase-inversion element 101.

Note that in the memory device of this embodiment, the potential VH is not a fixed potential, which can also be the precharge potential and the potential VDD at least. Similarly, the low-level potential VL is not a fixed potential, which can also be the precharge potential and the potential VSS at least. Therefore, when operation mode of the memory device is changed, the potential VH is also changed in some cases.

The second phase-inversion element 102 in FIG. 1B has a structure in which a p-channel transistor 109 and an n-channel transistor 110 whose gate electrodes are connected to each other are connected in series between the first node and the second node. Specifically, a source electrode of the p-channel transistor 109 is connected to the first node, and a source electrode of the n-channel transistor 110 is connected to the second node.

In addition, a drain electrode of the p-channel transistor 109 is connected to a drain electrode of the n-channel transistor 110, and potentials of these two drain electrodes can be regarded as a potential of the output terminal of the second phase-inversion element 102. In addition, potentials of the gate electrode of the p-channel transistor 109 and the gate electrode of the n-channel transistor 110 can be regarded as a potential of the input terminal of the second phase-inversion element 102.

In FIG. 1B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof.

Note that in FIG. 1B, a structure in which each of the switching element 103 and the switching element 104 includes only one transistor is illustrated; however, the present invention is not limited to this structure. In one embodiment of the present invention, the switching element 103 or the switching element 104 may include a plurality of transistors.

In the case where a plurality of transistors which serve as switching elements are included in the switching element 103 or the switching element 104, the plurality of transistors may be connected to each other in parallel, in series, or in combination of parallel connection and series connection.

In the case where a plurality of transistors is connected in parallel, polarity thereof may be different. For example, a so-called transfer gate structure in which an n-channel transistor and a p-channel transistor are connected in parallel may be employed.

In FIG. 1B, a transistor including an oxide semiconductor in a channel formation region is used for the capacitor switching element 106, and the switching of the transistor is controlled by a signal Sig. 3 supplied to a gate electrode thereof. Since the transistor used for the capacitor switching element 106 includes a highly purified oxide semiconductor in a channel formation region, the amount of off-state current thereof is extremely small as described above.

In FIG. 1B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

In one embodiment of the present invention, at least a transistor used for a switching element in the capacitor switching element 106 may include a highly purified oxide semiconductor in a channel formation region.

On the other hand, each of the transistors used for the first phase-inversion element 101, the second phase-inversion element 102, the switching element 103, and the switching element 104 can include a semiconductor other than an oxide semiconductor, e.g., an amorphous, microcrystalline, polycrystalline, or single crystal semiconductor can be used. As such a material of a semiconductor, silicon, germanium, gallium arsenide, gallium phosphide, indium phosphide, or the like can be given. The transistor may be manufactured with use of a thin semiconductor film or a bulk (semiconductor wafer).

Figure 7A:
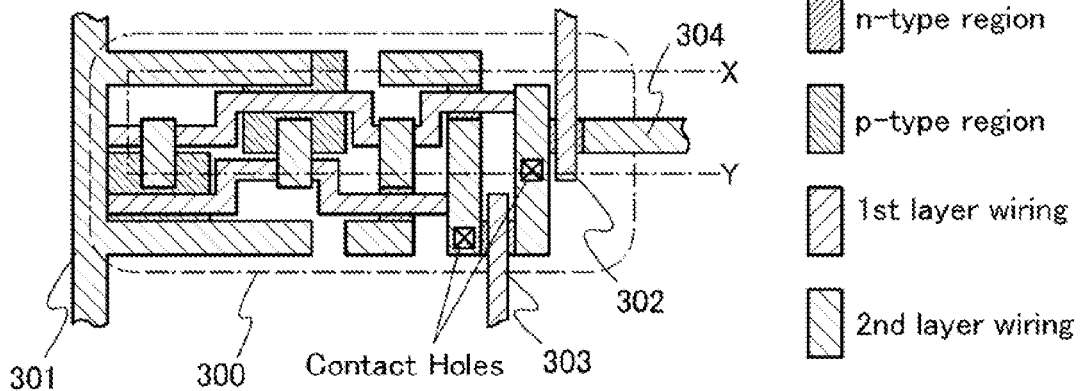
FIGS. 7A to 7D are top views illustrating a structure of a memory element.

A circuit arrangement of a memory element in this embodiment is described with reference to FIGS. 7A to 7D. FIG. 7A illustrates a layout of one memory element 300. The memory element 300 corresponds to the memory element 100 in FIGS. 1A and 1B. An inverter or the like which is a main component of the memory element 300 may be formed by using a known semiconductor technique. On a semiconductor wafer, a shallow trench isolation (STI) region for element isolation, an n-type region, and a p-type region are formed. A first layer wiring which serves as a gate layer is formed thereover, and then a second layer wiring is further formed thereover.

A part of the first layer wiring is a Sig. 1 wiring 302 for supplying a signal Sig. 1, and another part thereof is a Sig. 2 wiring 303 for supplying a signal Sig. 2. A part of the second layer wiring is a VH wiring 301 for supplying a potential VH, and a part thereof is an N wiring 304 for inputting a signal N. In FIG. 7A, positions of contact holes through which wirings are connected to the upper component are shown.

Figure 7B:
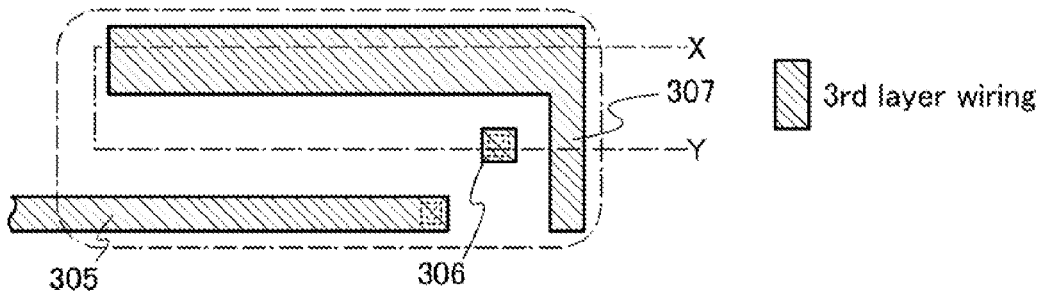

Further, as illustrated in FIG. 7B, a third layer wiring is provided over the structure of FIG. 7A, and a part of the third layer wiring is connected to a part of the second layer wiring through the contact hole, which serves as an OUT wiring 305 for outputting a signal OUT. The other parts of the third layer wiring function as a drain electrode 306 and a source electrode 307 of a transistor as a switching element, including an oxide semiconductor. The drain electrode 306 is connected to a part of the second layer wiring through the contact hole. The source electrode 307 serves as a part of an electrode of an element formed in a later step, which corresponds to the capacitor 105 in FIGS. 1A and 1B.

Figure 7C:
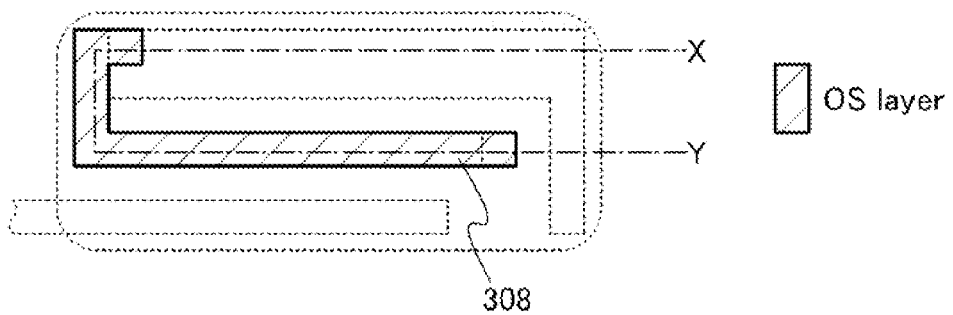

Over the third layer wiring, an oxide semiconductor layer (OS layer) is formed. As illustrated in FIG. 7C, the oxide semiconductor layer has at least one hollow portion and thus has an oxide semiconductor region 308 with a J-shape, for example. Alternatively, the oxide semiconductor region 308 may have a U-shape, an L-shape, a V-shape, or a C-shape. Further alternatively, a shape having two or more hollow portions (e.g., an M-shape, an N-shape, an S-shape, a W-shape, a Z-shape, or the like), or a bent shape other than the above may be employed.

With the above shape, the length from one end portion to the other end portion of the oxide semiconductor region 308 can be larger than the long side of the memory element 300. For example, given that the minimum feature size is F, the length from one end portion to the other end portion can be 10 F or more, preferably 20 F or more, further preferably 50 F or more. In a transistor (corresponding to the capacitor switching element 106 in FIGS. 1A and 1B) which is formed using the oxide semiconductor region 308 with the above shape, the channel length can be 10 F or more, preferably 20 F or more, further preferably 50 F or more.

In FIG. 7C, the length from one end to the other end of the oxide semiconductor region 308 is approximately 17 F. By making the channel length large in this manner, deterioration of off-state characteristics due to a short-channel effect can be suppressed.

Figure 7D:
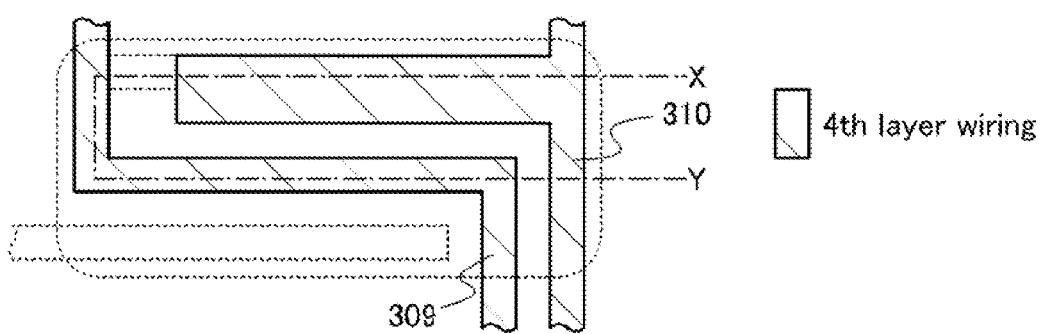

Over the oxide semiconductor layer, a fourth layer wiring is provided as illustrated in FIG. 7D. A gate wiring 309 and a capacitor wiring 310 are formed of the fourth layer wiring. A part of the gate wiring 309 serves as a gate electrode of the capacitor switching element 106 illustrated in FIGS. 1A and 1B. Note that the signal Sig. 3 is supplied to the gate wiring 309. Further, the capacitor wiring 310 partly overlaps with the source electrode 307 to form a part of the capacitor 105 in FIGS. 1A and 1B. In the case of FIG. 7D, the area of electrodes of the capacitor (an area where two electrodes overlap with each other) is 28 $F^2$. Note that the potential VE is supplied to the capacitor wiring 310.

Figure 8A:
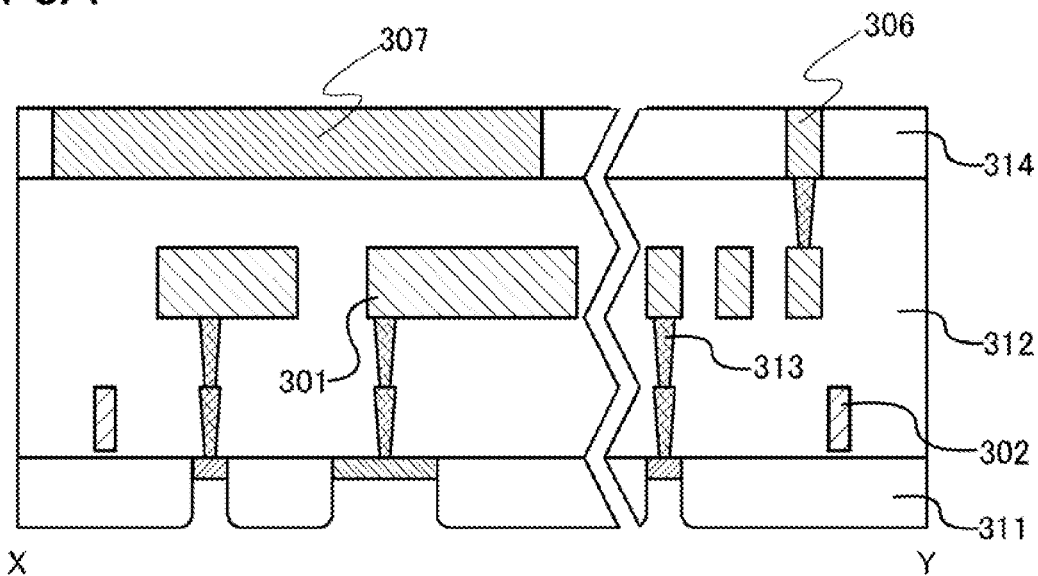
FIGS. 8A and 8B are cross-sectional views illustrating a structure of a memory element.
Figure 8B:
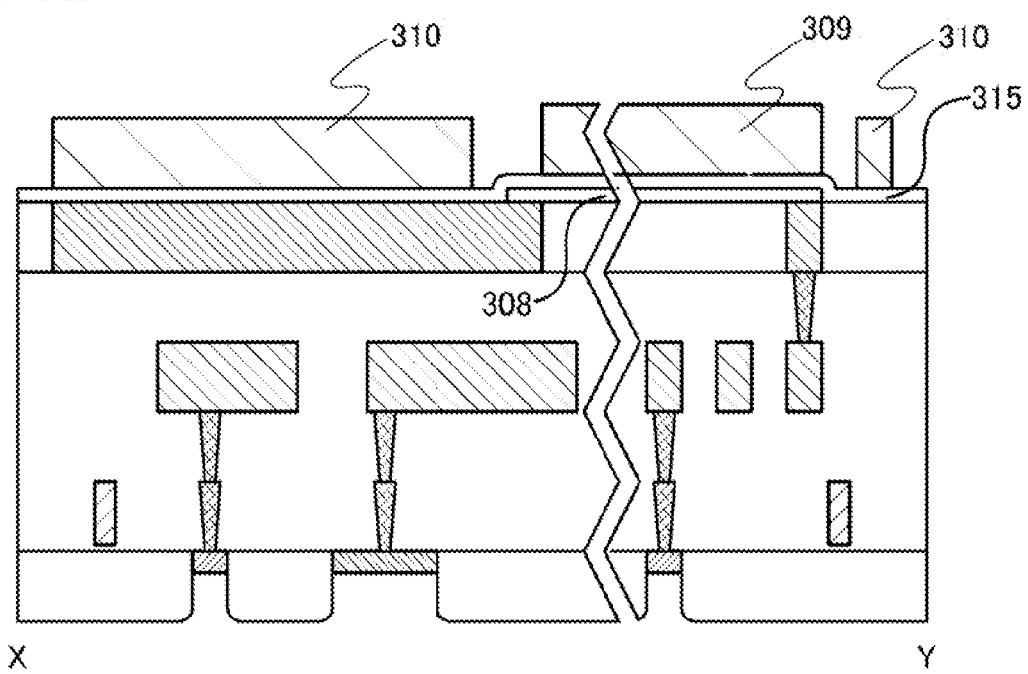

FIGS. 8A and 8B schematically illustrate a cross-sectional structure of the memory element 300 along dashed dotted line X-Y in FIGS. 7A to 7D. Note that in FIGS. 8A and 8B and FIGS. 7A to 7D, the same hatching denotes the same component.

FIG. 8A is a cross-sectional view of a structure in FIG. 7B. An STI 311, the n-type region, and the p-type region are formed on the semiconductor wafer, and the first layer wiring, and the second layer wiring are provided, so that a circuit (e.g., the VH wiring 301 or the Sig. 1 wiring 302) is formed. An interlayer insulator 312 is provided over the n-type and p-type regions so that the first layer wiring and the second layer wiring are embedded. In the case where electrical connection between the n-type, p-type regions and the first layer wiring and the second layer wiring is needed, a contact plug 313 is provided. Further, over the interlayer insulator 312, the drain electrode 306 and the source electrode 307 formed of the third layer wiring are embedded in an embedding insulator 314.

FIG. 8B is a cross-sectional view of a structure in FIG. 7D. Over the structure illustrated in FIG. 8A, an oxide semiconductor layer (such as the oxide semiconductor region 308), a gate insulator 315, and the fourth layer wiring (the gate wiring 309 or the capacitor wiring 310) are further formed. Here, the thickness of the oxide semiconductor layer is 1 nm to 30 nm, preferably 1 nm to 10 nm, and the thickness of the gate insulator 315 is 2 nm to 30 nm, preferably 5 nm to 10 nm.

Further, as described in Patent Document 3, one or a plurality of materials with a high work function may be provided in contact with the oxide semiconductor layer. With such a structure, the oxide semiconductor layer can be depleted, which is effective in an increase in off-resistance.

In this embodiment, since quality of an oxide semiconductor layer is valued, a highly purified oxide semiconductor (film) may be used. A method for manufacturing such an oxide semiconductor (film) will be described in Embodiment 9.

Next, an example of operation of the memory element illustrated in FIG. 1A is described. Note that the memory element can be operated by a method other than the following description.

First, in writing data, the switching element 103 is turned on, the switching element 104 is turned off, and the capacitor switching element 106 is turned off. Then, the potential VDD is supplied to the first node and the potential VSS is supplied to the second node.

A potential of the signal N supplied to the memory element 100 is supplied to the input terminal of the first phase-inversion element 101 via the switching element 103, whereby the potential of the output terminal of the first phase-inversion element 101 is a phase-inverted potential of the signal N. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in the case where data is held by the first phase-inversion element 101 and the second phase-inversion element 102, in the state where the switching element 104 remains in an on-state and the capacitor switching element 106 remains in an off-state, the switching element 103 is turned off. By turning off the switching element 103, the input data is held by the first phase-inversion element 101 and the second phase-inversion element 102. At this time, the potential VDD is supplied to the first node and the potential VSS is supplied to the second node, whereby the state in which the power supply voltage is applied between the first node and the second node is maintained.

The potential of the output terminal of the first phase-inversion element 101 reflects the data held by the first phase-inversion element 101 and the second phase-inversion element 102. Therefore, by reading out the potential, the data can be read out from the memory element 100.

Note that in the case where the input data is held by the capacitor 105 in order to reduce power consumption in holding the data, first, the switching element 103 is turned off, the switching element 104 remains in an on-state, and the capacitor switching element 106 is turned on. Then, via the capacitor switching element 106, electric charge with an amount corresponding to the value of the data held by the first phase-inversion element 101 and the second phase-inversion element 102 is stored in the capacitor 105, whereby the data is written into the capacitor 105.

After the data is stored in the capacitor 105, the capacitor switching element 106 is turned off, whereby the data stored in the capacitor 105 is held. After the capacitor switching element 106 is turned off, the first node and the second node both are set to, for example, the potential VSS or a precharge potential described later. In particular, the first node and the second node both are preferably set to the precharge potential, which will be described later. Note that after the data is stored in the capacitor 105, the switching element 104 may be turned off.

In such a manner, in the case where the input data is held by the capacitor 105, the application of the power supply voltage between the first node and the second node is unnecessary; therefore, the off-state current flowing between the first node and the second node via the p-channel transistor 107 and the n-channel transistor 108 which are included in the first phase-inversion element 101, or via the p-channel transistor 109 and the n-channel transistor 110 which are included in the second phase-inversion element 102 can be extremely close to zero.

As a result, power consumption due to the off-state current of the memory element in holding data can be significantly reduced, and accordingly the power consumption of the memory device and further the signal processing circuit including the memory device can be suppressed to be low.

Since the transistor used for the capacitor switching element 106 includes a highly-purified oxide semiconductor in a channel formation region, the off-state current density can be less than or equal to 100 zA/μm, preferably less than or equal to 10 zA/μm, further preferably less than or equal to 1 zA/μm.

Moreover, in the transistor having a long and narrow channel, the off-state current is less than or equal to 1 zA. As a result, when the capacitor switching element 106 for which the transistor is used is off, charge stored in the capacitor 105 is hardly released; therefore, the data is held.

Next, a method for transferring data stored in the capacitor 105 to the first phase-inversion element 101 and the second phase-inversion element 102 (method for restoring data) will be described.

Although specific values of potentials are given below for easy understanding, potentials other than the given potentials can be used as appropriate. Here, the high-level potential VDD is set to +1 V, the low-level potential VSS is set to 0 V, and the precharge potential is set to +0.5 V. In order to restore data, at least the following three steps need to be performed. Note that in the process described below in this embodiment, the potential VE is fixed at 0 V.

<Precharge>

The potentials of the input terminals and the output terminals of the first phase-inversion element 101 and the second phase-inversion element 102 are set to +0.5 V, that is, the precharge potential. In order that, the potentials of the first node and the second node are set to +0.5 V.

In addition, the signal IN and the signal OUT are set to the precharge potential or a floating potential. It is preferable that potentials of all the terminals connected to a memory device including the memory element 100 are set to the precharge potential, and then set to the floating potential.

When the signal IN or the signal OUT is set to the floating potential, the switching element 103 is turned off. Note that the capacitor switching element 106 is kept off. The switching element 104 may be either off or on. After several milliseconds to several seconds, the potential of the input terminal of the first phase-inversion element 101 and the potential of the output terminal of the second phase-inversion element 102 become +0.5 V.

After the data is transferred to the capacitor 105 in the above manner, the potential of the first node and the potential of the second node are set to the precharge potential; whereby changing the potentials is unnecessary here, and the following steps of discharge can be performed.

Note that just before the step of discharge, the potentials of the input terminals of the first phase-inversion element 101 and the second phase-inversion element 102 may reflect the potentials which have been held in some cases, which does not cause a practical problem.

For example, when the potentials of the input terminals of the first phase-inversion element 101 and the second phase-inversion element 102, before the first phase-inversion element 101 and the second phase-inversion element 102 are deactivated, are +1 V and 0 V, respectively, the potentials of the input terminals of the first phase-inversion element 101 and the second phase-inversion element 102 just before the step of discharge are +0.5 V or higher, and +0.5 V or lower, respectively. For example, the potentials of the input terminals of the first phase-inversion element 101 and the second phase-inversion element 102 may be +0.6 V and +0.4 V, respectively, or +0.51 V and +0.49 V, respectively.

A potential difference between the precharge potential and the potential just before the step of discharge depends on a period of time while the first phase-inversion element 101 and the second phase-inversion element 102 are deactivated. As the period is shorter, the potential just before the step of discharging becomes close to the potential before the phase-inversion element is deactivated. In any case, the potentials of the input terminals of the first phase-inversion element 101 and the second phase-inversion element 102 just before the step of discharge is in accordance with the held data, and the data does not become inversed by an influence of the following discharge.

<Discharge>

Next, the capacitor switching element 106 is turned on. As a result, the potential of a circuit which is connected to the capacitor switching element 106 changes. On the other hand, the potential of the circuit which is not connected to the capacitor switching element 106 hardly changes. Note that before this operation (preferably, before the precharge), the switching element 104 is preferably turned on.

This change in potential is determined in accordance with the capacitance of the capacitor 105, the capacitance of the circuit connected to the capacitor switching element 106 (hereinafter referred to as parasitic capacitance, except for the capacitance of the capacitor 105), the capacitance of the capacitor switching element 106, and the like. As the capacitance of the capacitor 105 is larger than the parasitic capacitance, the change in potential becomes pronounced. Note that in general, the parasitic capacitance with respect to the capacitor 105 is not small enough to ignore, and is greater than or equal to ⅓ times the capacitor.

For example, the area of the capacitor illustrated in FIGS. 7A to 7D is 28 $F^2$. When F=30 nm and a 10-nm-thick silicon oxide is used as a dielectric, the capacitance is approximately 0.09 fF. In this case, the parasitic capacitance is estimated to be approximately 0.1 fF. That is, the parasitic capacitance is comparable to the capacitance of the capacitor. Further, in the case of using a transistor with a large channel length as in FIGS. 7A to 7D as a capacitor switching element, an influence of the gate capacitance (in the above case, the gate capacitance is approximately 61% of the capacitance of the capacitor) cannot be ignored.

In that case, for example, when high-level data is stored in the capacitor 105 (i.e., a potential of +1 V is stored), the potential of a gate of the capacitor switching element 106 is set to +2 V and the capacitor switching element 106 is turned on so that charge stored in the capacitor 105 is released to the first phase-inversion element 101; as a result, the potential of the circuit connected to the capacitor switching element 106 becomes approximately +1.02 V. This is greatly influenced by a potential of +2 V applied to the gate of the capacitor switching element 106.

Even when low-level data is stored in the capacitor 105 (i.e., a potential of 0 V is stored), the capacitor switching element 106 is turned on so that charge stored in the capacitor 105 is released to the first phase-inversion element 101; as a result, the potential of a circuit connected to the capacitor switching element 106 becomes approximately +0.65 V, which is higher than the precharge potential. This is also greatly influenced by a potential of +2 V applied to the gate of the capacitor switching element 106.

When the gate capacitance of the capacitor switching element 106 is too large to ignore (specifically in the case where the gate capacitance of the capacitor switching element 106 is greater than or equal to 30% of the capacitance of the capacitor 105) as described above, the potential of the gate of the capacitor switching element 106 serves a disturbing factor; therefore, the capacitor switching element 106 is preferably turned off after the discharge. Further, the gate capacitance of the capacitor switching element 106 is preferably less than or equal to twice the capacitance of the capacitor 105.

The influence of the gate capacitance of the capacitor switching element 106 disappears while the capacitor switching element 106 is in an off-state. Thus, when, for example, high-level data is stored in the capacitor 105, the potential of the input terminal of the first phase-inversion element 101 becomes approximately +0.75 V, which is higher than the precharge potential of +0.5 V, and when low-level data is stored in the capacitor 105, the potential of the input terminal of the first phase-inversion element 101 becomes approximately +0.28 V, which is lower than the precharge potential.

Note that in the case where the precharge potential is 0 V, the potential of the input terminal of the first phase-inversion element 101 when high-level data is stored in the capacitor 105 becomes 0.49V, and the potential of the input terminal of the first phase-inversion element 101 when low-level data is stored in the capacitor 105 becomes 0.02V. In either case, the potential of the input terminal of the first phase-inversion element 101 is higher than the potential of the input terminal of the second phase-inversion element 102 (the precharge potential of 0 V), which causes an error in amplification to be performed later; therefore, it is necessary to select an appropriate precharge potential.

<Amplification>

Next, the potential of the first node is changed from +0.5 V to +1 V, and the potential of the second node is changed from +0.5 V to 0 V. It is preferable that the potentials of the first node and the second node be changed symmetrically. Further, in order to decrease the probability of occurrence of an error, the change is performed slowly as much as possible.

By such a manner, a difference between the potential of the input terminal of the first phase-inversion element and the potential of the input terminal of the second phase-inversion element is amplified. The smaller the potential difference is or the shorter a period of time for amplification is, the higher an error during amplification is more likely occur. The acceptable time for operation of power return is far long as compared to the clock frequency of a general memory. Amplification which is performed slowly makes it possible to decrease the probability of an error even when the potential difference is small.

Although a thin film transistor formed with use of a highly purified oxide semiconductor is used as the capacitor switching element 106 in the above, a thin film transistor formed with use of, for example, amorphous silicon, polysilicon, or microcrystalline silicon may be used.

In that case, the off-state current becomes larger than that of the thin film transistor formed with use of a highly purified oxide semiconductor; as a result, a period for holding data becomes short. However, data can be continuously held by performing the "refresh" as follows: outputting data periodically to the first phase-inversion element 101 and the second phase-inversion element 102 and sending data back to the capacitor 105 are repeated.

As for this reflesh, the refresh can be operated on all memory elements which need to be refreshed at the same time in one chip, which is different from the refresh in a DRAM. Therefore, time needed for the refresh in one chip is extremely short. Of course, the refresh in one chip may be sequentially performed per block of memory elements.

Embodiment 2

Figure 3A:
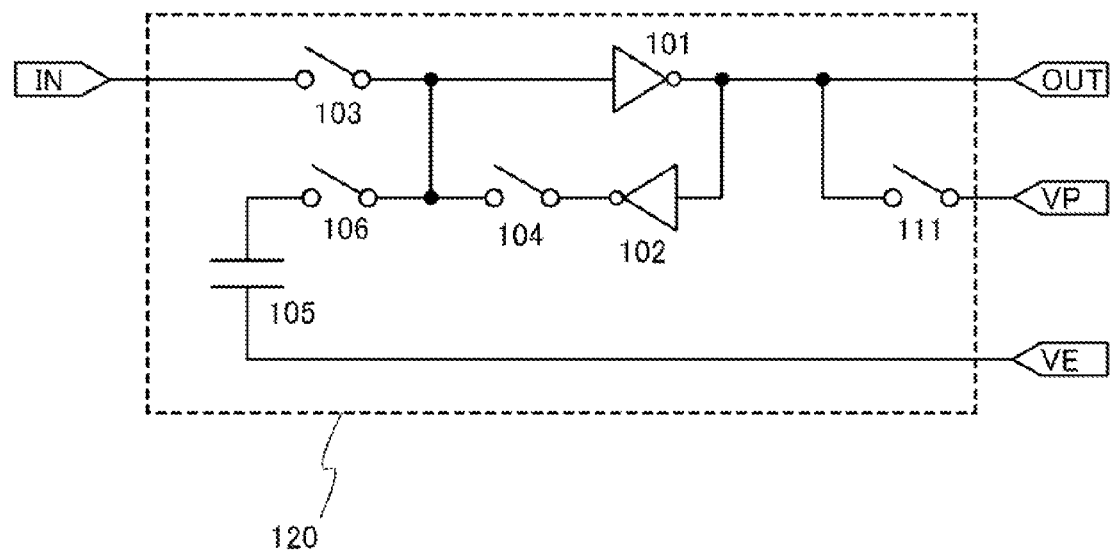
FIGS. 3A and 3B are circuit diagrams of a memory element.

In this embodiment, another example of a memory element included in a memory device of the present invention will be described. FIG. 3A is a circuit diagram illustrating a memory element of this embodiment.

A memory element 120 illustrated in FIG. 3A at least includes a first phase-inversion element 101 and a second phase-inversion element 102 by which the phase of an input signal is inverted and the signal is output, a switching element 103, a switching element 104, a capacitor 105, and a capacitor switching element 106.

The memory element 120 also includes a switching element 111. The switching element 111 is provided between the input terminal of the second phase-inversion element 102 and the node to which the precharge potential VP is supplied, and controlled by a signal Sig. 4.

A signal IN including data that is input to the memory element 120 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. The potential of the output terminal of the first phase-inversion element 101 or the potential of the input terminal of the second phase-inversion element 102 is output to a memory element or another circuit of a subsequent stage as a signal OUT.

The capacitor 105 is connected to an input terminal of the memory element 120, i.e., a node to which a potential of the signal IN is supplied, via the switching element 103 and the capacitor switching element 106 so that the data of the signal IN that is input to the memory element 120 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

Note that in FIG. 3A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

For the capacitor switching element 106, a transistor including a highly purified oxide semiconductor in a channel formation region is used. Like the capacitor switching element 106 in Embodiment 1, the capacitor switching element 106 may be formed above the first phase-inversion element 101 and the second phase-inversion element 102 with use of an oxide semiconductor, and the channel length may be greater than or equal to 10 F, preferably greater than or equal to 20 F, further preferably greater than or equal to 50 F.

Note that the memory element 120 may further include another circuit element such as a diode, a resistor, an inductor, or a capacitor, as needed.

Figure 3B:
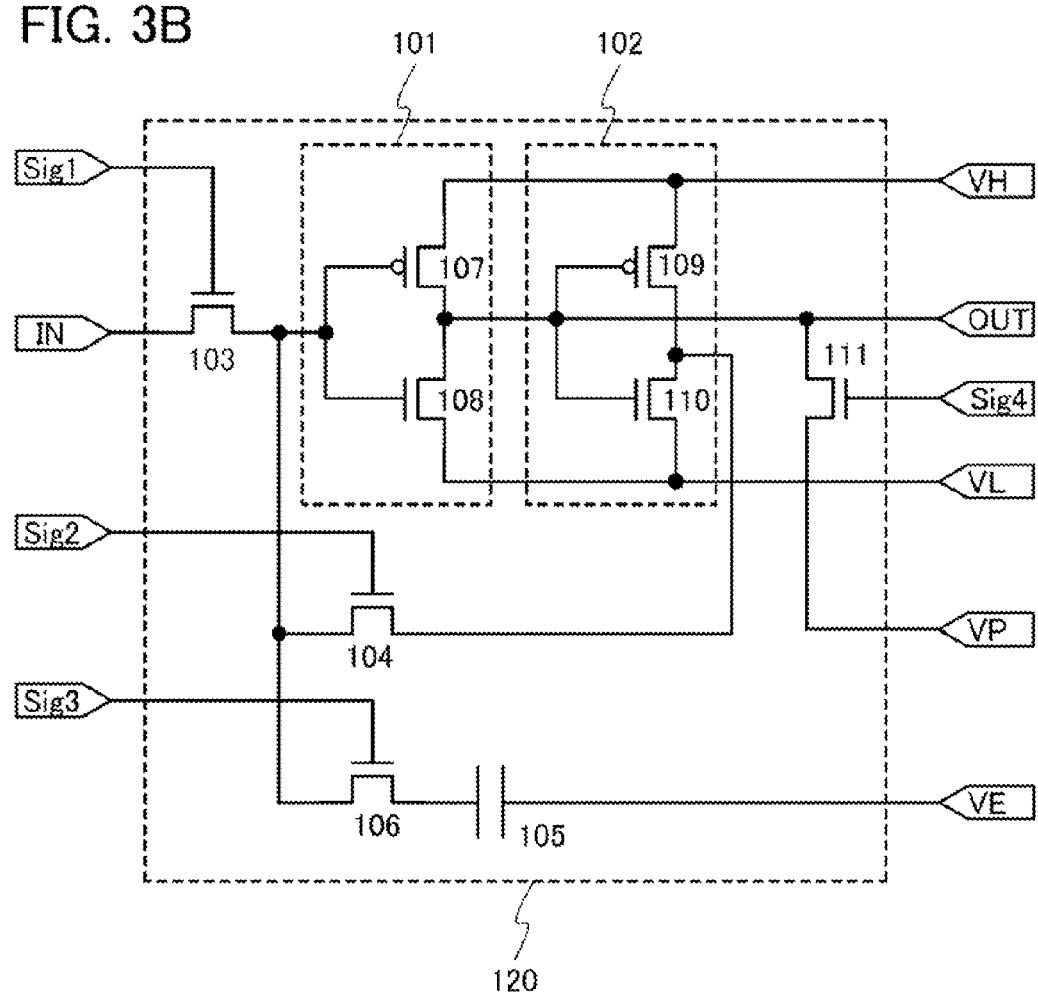

Next, an example of a specific circuit diagram of the memory element in FIG. 3A is illustrated in FIG. 3B. The memory element 120 in FIG. 3B includes at least the first phase-inversion element 101, the second phase-inversion element 102, the switching element 103, the switching element 104, the capacitor 105, the capacitor switching element 106, and the switching element 111. The connection structure of these circuit elements is the same as that in FIG. 3A. Embodiment 1 can be referred to for details of the first phase-inversion element 101 and the second phase-inversion element 102 in FIG. 3B.

In FIG. 3B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof. Further, the case where one transistor is used for the switching element 111 is illustrated as an example, and the switching of this transistor is controlled by a signal Sig. 4 supplied to a gate electrode thereof.

Note that in FIG. 3B, a structure in which each of the switching element 103, the switching element 104, and the switching element 111 includes only one transistor is illustrated; however, the present invention is not limited to this structure. In one embodiment of the present invention, the switching element 103, the switching element 104, or the switching element 111 may include a plurality of transistors.

In the case where a plurality of transistors which serve as switching elements are included in the switching element 103, the switching element 104, or the switching element 111, the plurality of transistors may be connected to each other in parallel, in series, or in combination of parallel connection and series connection.

In FIG. 3B, a transistor including an oxide semiconductor in a channel formation region is used for the capacitor switching element 106, and the switching of the transistor is controlled by a signal Sig. 3 supplied to a gate electrode thereof. Since the transistor used for the capacitor switching element 106 includes a highly purified oxide semiconductor in a channel formation region, the amount of off-state current thereof is extremely small as described above.

In FIG. 3B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 includes a compound semiconductor, e.g., a highly purified oxide semiconductor, in a channel formation region.

On the other hand, each of the transistors used for the first phase-inversion element 101, the second phase-inversion element 102, the switching element 103, the switching element 104, and the switching element 111 can include a semiconductor other than an oxide semiconductor, e.g., an amorphous, microcrystalline, polycrystalline, or single crystal semiconductor can be used. As such a material of a semiconductor, silicon and germanium can be given. The transistor may be manufactured with use of a thin semiconductor film or a bulk semiconductor wafer.

If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 3A or FIG. 3B is described. Note that the memory element can be operated by a method other than the following description. The switching element 111 is turned off in order to operate data writing, data retention by the first phase-inversion element 101 and the second phase-inversion element 102, and input data retention by the capacitor 105. Details are the same as those in Embodiment 1 and thus omitted.

In order to recover data stored in the capacitor 105, steps of precharge, discharge, and amplification are performed as in Embodiment 1. Part of a step of precharge differs from the process of precharge in Embodiment 1. In the memory element 120 of this embodiment, the signal IN, the first node, and the second node are at least set to the precharge potential.

Then, the switching element 103, the switching element 104, and the switching element 111 are turned on. As a result, in addition to the input terminal of the first phase-inversion element 101, the input and output terminals of the second phase-inversion element 102 can be the precharge potential rapidly (within one microsecond).

After that, the switching element 103 is turned off. Discharge and amplification may be performed in the manner described in Embodiment 1.

Figure 2A:
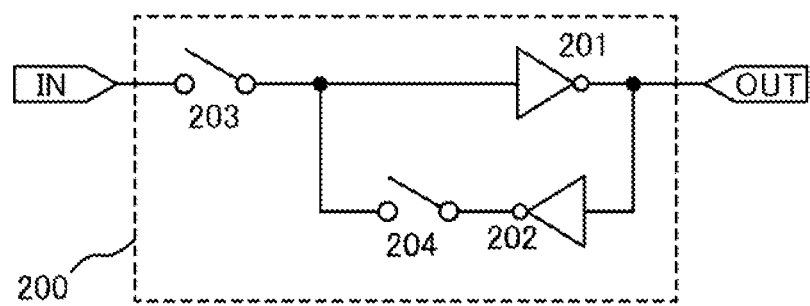
FIGS. 2A to 2C are circuit diagrams of conventional memory elements.
Figure 2B:
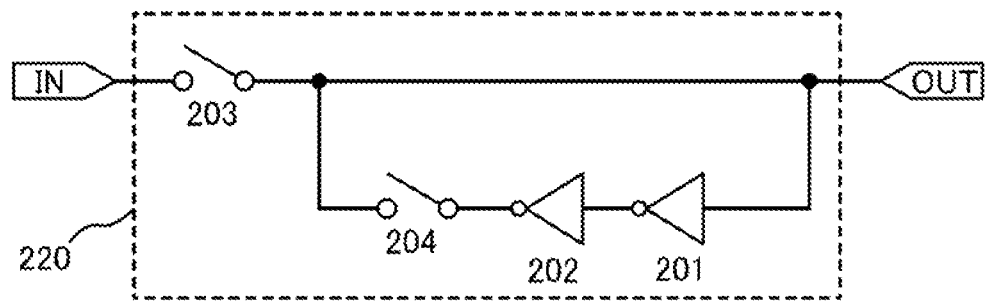
Figure 2C:
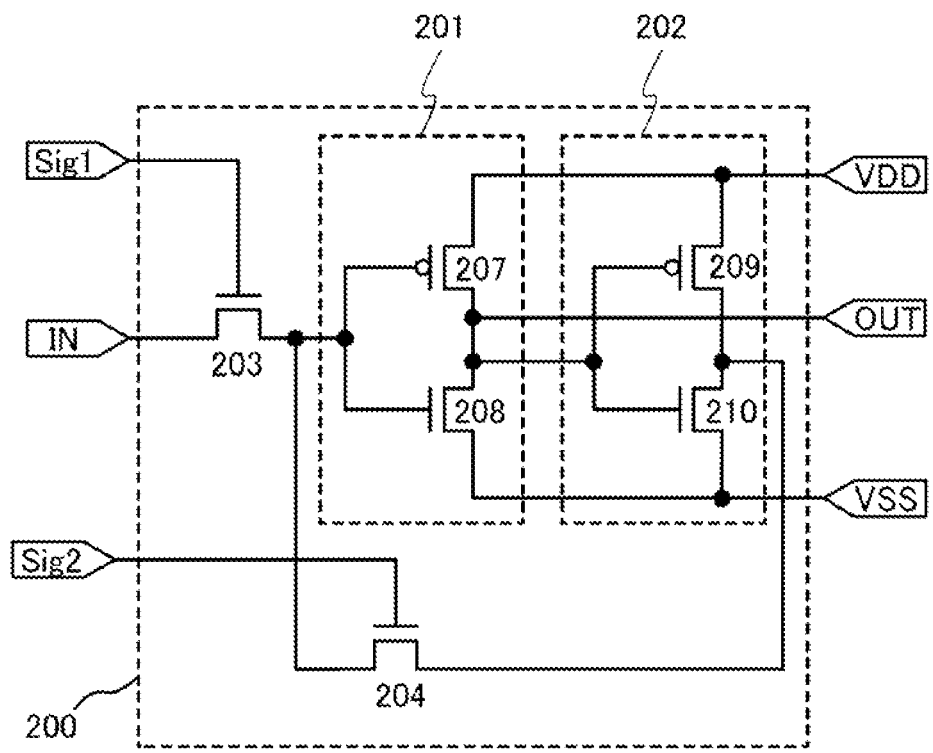

In the conventional memory element 200 in FIGS. 2A to 2C, a plurality of memory elements is connected in series, which is the same as in the memory element 120 illustrated in FIGS. 3A and 3B. An operation example will be described below of a circuit in which memory elements 120a and 120b are connected in series, with reference to FIGS. 10A to 10C and FIGS. 11A to 11C. The memory elements 120a and 120b each have a circuit configuration the same as that of the memory element 120 in FIGS. 3A and 3B.

Note that in FIGS. 10A to 10C and FIGS. 11A to 11C, transistors in an on-state and phase-inversion circuits in an active state are marked with a circle, and transistors in an off-state and phase-inversion circuits in a non-active state are marked with a cross.

<FIG. 10A>

Data is held in each of the memory element 120a and the memory element 120b. Here, in the memory element 120a, the potential of the input terminal of the first phase-inversion element is +1 V and the potential of the output terminal thereof is 0 V; in the memory element 120b, the potential of the input terminal of the first phase-inversion element is 0 V and the potential of the output terminal thereof is +1 V.

Figure 10A:
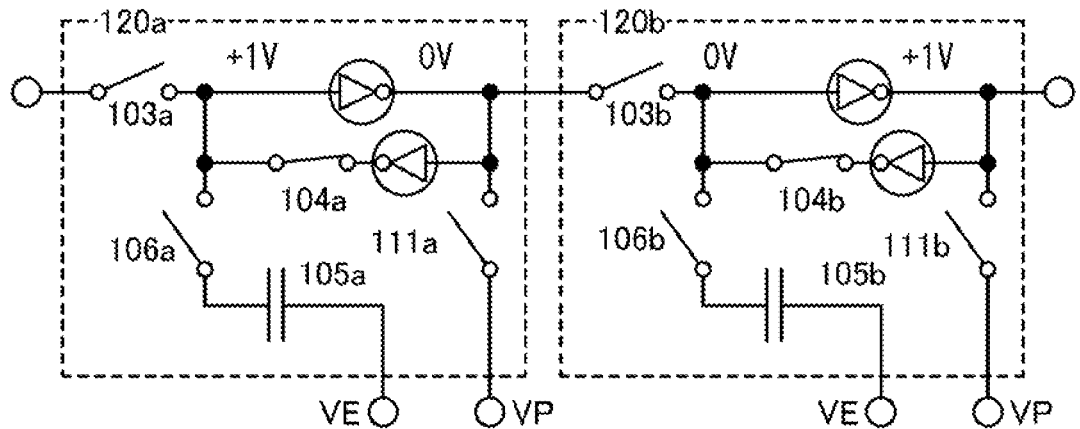
FIGS. 10A to 10C are diagrams illustrating operation examples of a memory element.
Figure 10B:
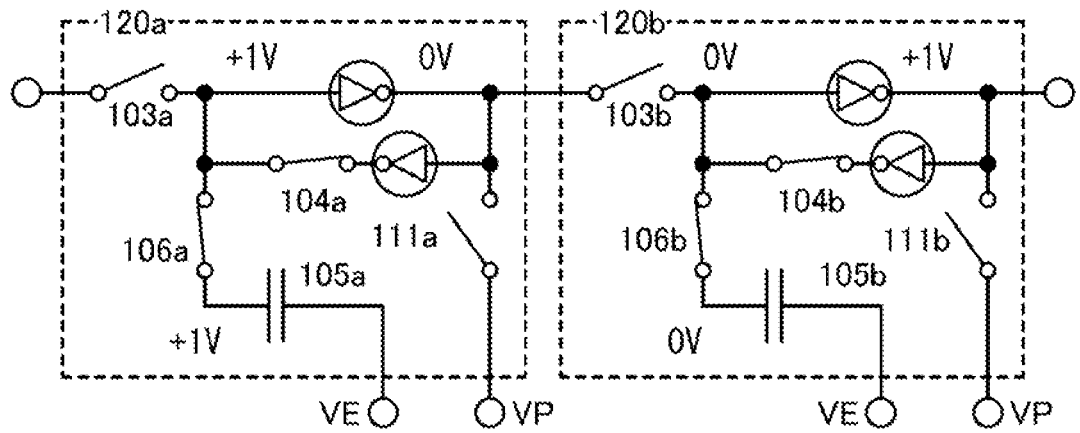
Figure 10C:
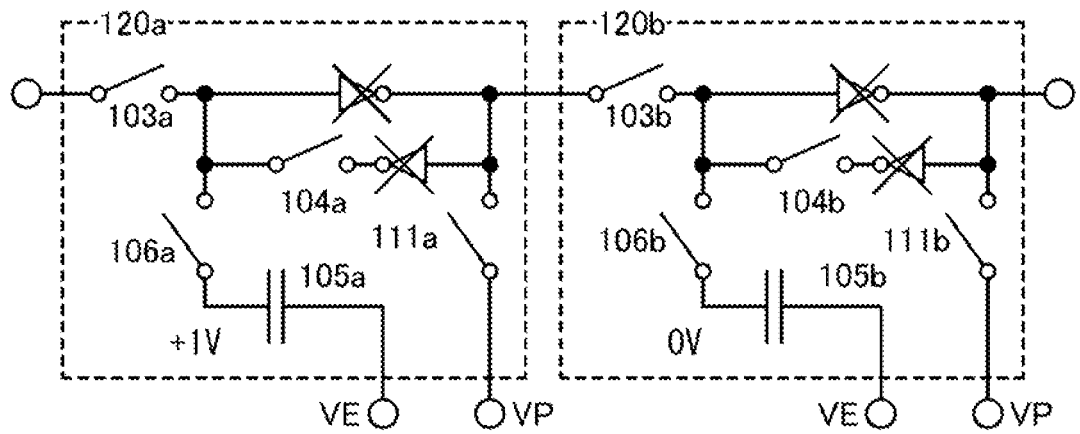

At this time, a switching element 103a, a switching element 103b, a capacitor switching element 106a, a capacitor switching element 106b, a switching element 111a, and a switching element 111b are in an off-state, and a switching element 104a and a switching element 104b are in an on-state.
<FIG. 10B>

The capacitor switching elements 106a and 106b are turned on. As a result, charge corresponding to data of the memory element 120a and the memory element 120b is stored in a capacitor 105a and a capacitor 105b, respectively.
<FIG. 10C>

After that, the switching element 104a, the switching element 104b, the capacitor switching element 106a, and the capacitor switching element 106b are turned off. In each of the memory element 120a and the memory element 120b, the first node and the second node of the first phase-inversion element and the second phase-inversion element are set to the same potential, for example, set to the precharge potential +0.5 V. Note that the switching elements 104a and 104b may be kept on.

In the above manner, the first phase-inversion element and the second phase-inversion element in each of the memory element 120a and the memory element 120b is deactivated. Data which has been stored in the first phase-inversion element and the second phase-inversion element in each of the memory element 120a and the memory element 120b can be held in the capacitor 105a and the capacitor 105b, respectively.
<FIG. 11A>

Precharge is performed. For the precharge, the potential of the input terminal of the first phase-inversion element in the memory element 120a is set to the precharge potential +0.5 V. Further, the switching element 103a, the switching element 103b, the switching element 104a, the switching element 104b, the switching element 111a, and the switching element 111b are turned on.

Figure 11A:
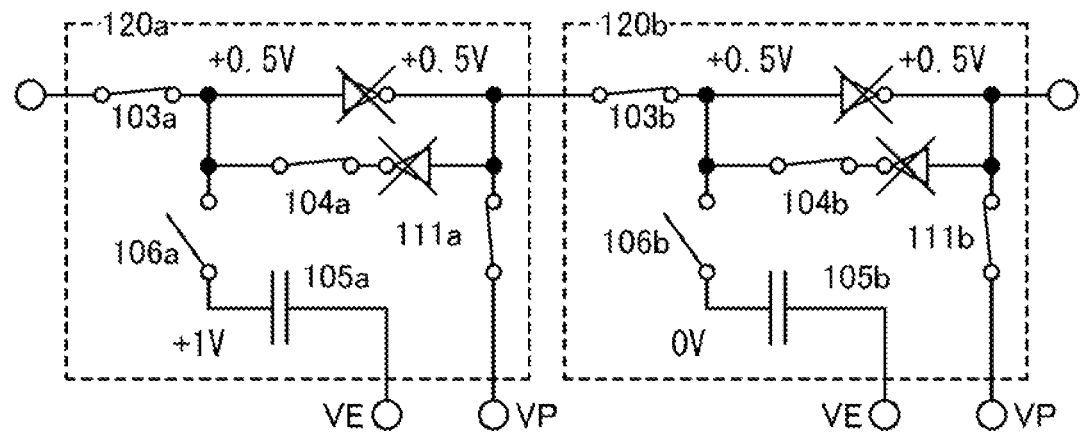
FIGS. 11A to 11C are diagrams illustrating operation examples of a memory element.
Figure 11B:
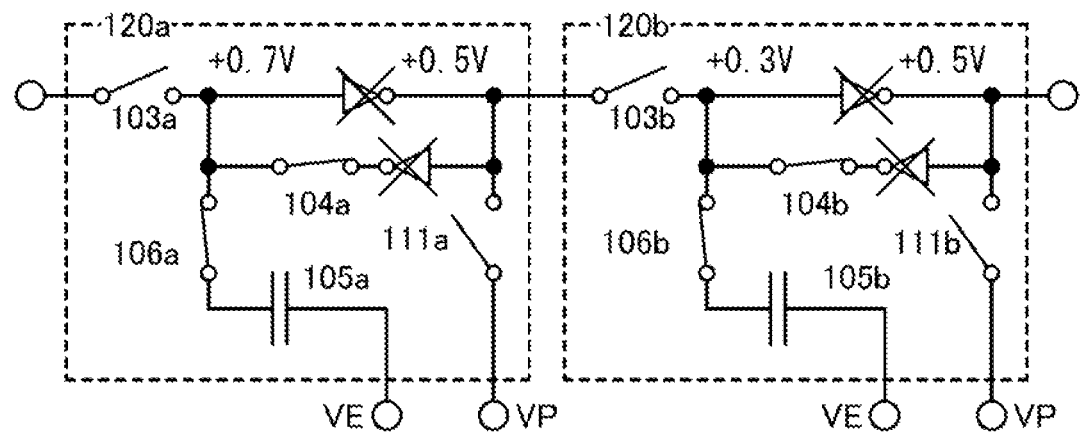

As a result, not only the potential of the input terminal of the first phase-inversion element in the memory element 120a, but also the potential of the output terminal of the first phase-inversion element in the memory element 120a and the potential of the input terminal and the potential of the output terminal of the first phase-inversion element in the memory element 120b become the precharge potential +0.5 V.
<FIG. 11B>

The switching element 103a, the switching element 103b, the switching element 111a, and the switching element 111b are turned off. Further, the capacitor switching element 106a and the capacitor switching element 106b are turned on. As a result, the potential of the input terminal of the first phase-inversion element in each of the memory element 120a and the memory element 120b varies in accordance with the stored data.

Figure 11C:
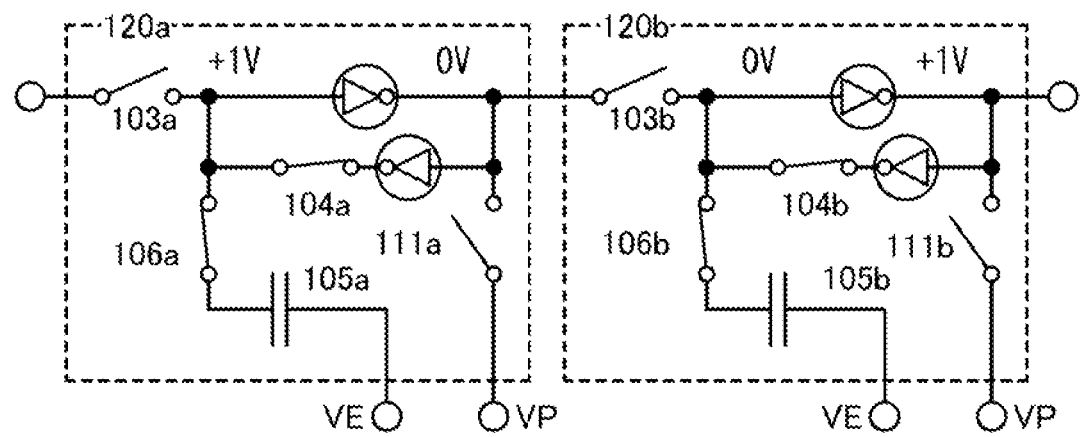

Here, suppose that the potential of the input terminal of the first phase-inversion element in the memory element 120a becomes +0.7 V, and that the potential of the input terminal of the first phase-inversion element in the memory element 120b becomes +0.3 V.
<FIG. 11C>

After that, in the memory element 120a and the memory element 120b, the first node and the second node of each of the first phase-inversion element and the second phase-inversion element are set to +1 V and 0 V, respectively. The first phase-inversion element and the second phase-inversion element in each of the memory element 120a and the memory element 120b become active, and amplify a potential difference of the respective input terminals. That is, a state shown in FIG. 10A can be reproduced.

Although a thin film transistor formed with use of a highly purified oxide semiconductor is used as the capacitor switching element in the above, a thin film transistor formed with use of, for example, amorphous silicon, polysilicon, or microcrystalline silicon may be used.

The matter disclosed in this embodiment can be implemented in appropriate combination with the matter described in the other embodiments.

Embodiment 3

Figure 4A:
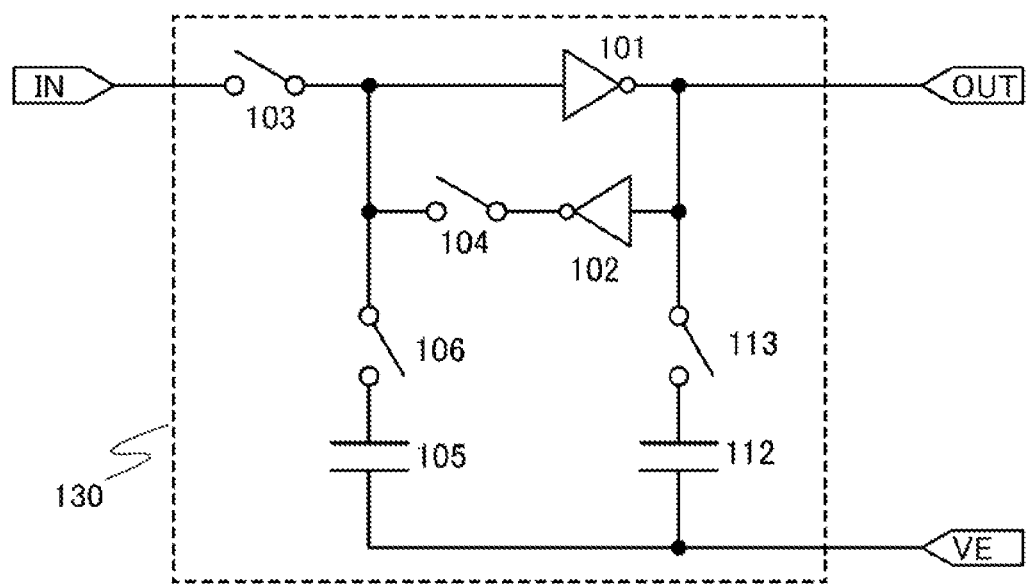
FIGS. 4A and 4B are circuit diagrams of a memory element.

In this embodiment, another example of a memory element included in a memory device of the present invention will be described. FIG. 4A is a circuit diagram illustrating an example of a memory element of this embodiment.

A memory element 130 illustrated in FIG. 4A at least includes a first phase-inversion element 101 and a second phase-inversion element 102 by which the phase of an input signal is inverted and the signal is output, a switching element 103, a switching element 104, a capacitor 105, a capacitor switching element 106, a capacitor 112, and a capacitor switching element 113.

A signal IN including data that is input to the memory element 130 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. The potential of the output terminal of the first phase-inversion element 101 or the potential of the input terminal of the second phase-inversion element 102 is output to a memory element or another circuit of a subsequent stage as a signal OUT.

The capacitor 105 is connected to an input terminal of the memory element 130, i.e., a node to which a potential of the signal IN is supplied, via the switching element 103 and the capacitor switching element 106 so that the data of the signal IN that is input to the memory element 130 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

In a manner similar to that of the capacitor 105, the capacitor 112 is connected to an input terminal of the memory element 130, i.e., a node to which a potential of the signal IN is supplied, via the switching element 103, the first phase-inversion element 101, and the capacitor switching element 113 so that the data of the signal IN input to the memory element 130 can be stored as needed. Specifically, the capacitor 112 includes a dielectric between a pair of electrodes. One of the electrodes is connected to the output terminal of the first phase-inversion element 101 via the capacitor switching element 113. The other of the electrodes is connected to a node to which a potential VE such as a ground potential is supplied.

Note that in FIG. 4A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

For the capacitor switching element 106 and the capacitor switching element 113, a transistor including a highly purified oxide semiconductor in a channel formation region is used. Like the capacitor switching element 106 in Embodiment 1, the capacitor switching element 106 and the capacitor switching element 113 are formed above the first phase-inversion element 101 and the second phase-inversion element 102 with use of an oxide semiconductor, and the channel length is greater than or equal to 10 F, preferably greater than or equal to 20 F, further preferably greater than or equal to 50 F.

Note that the memory element 130 may further include another circuit element such as a diode, a resistor, an inductor, or a capacitor, as needed.

Figure 4B:
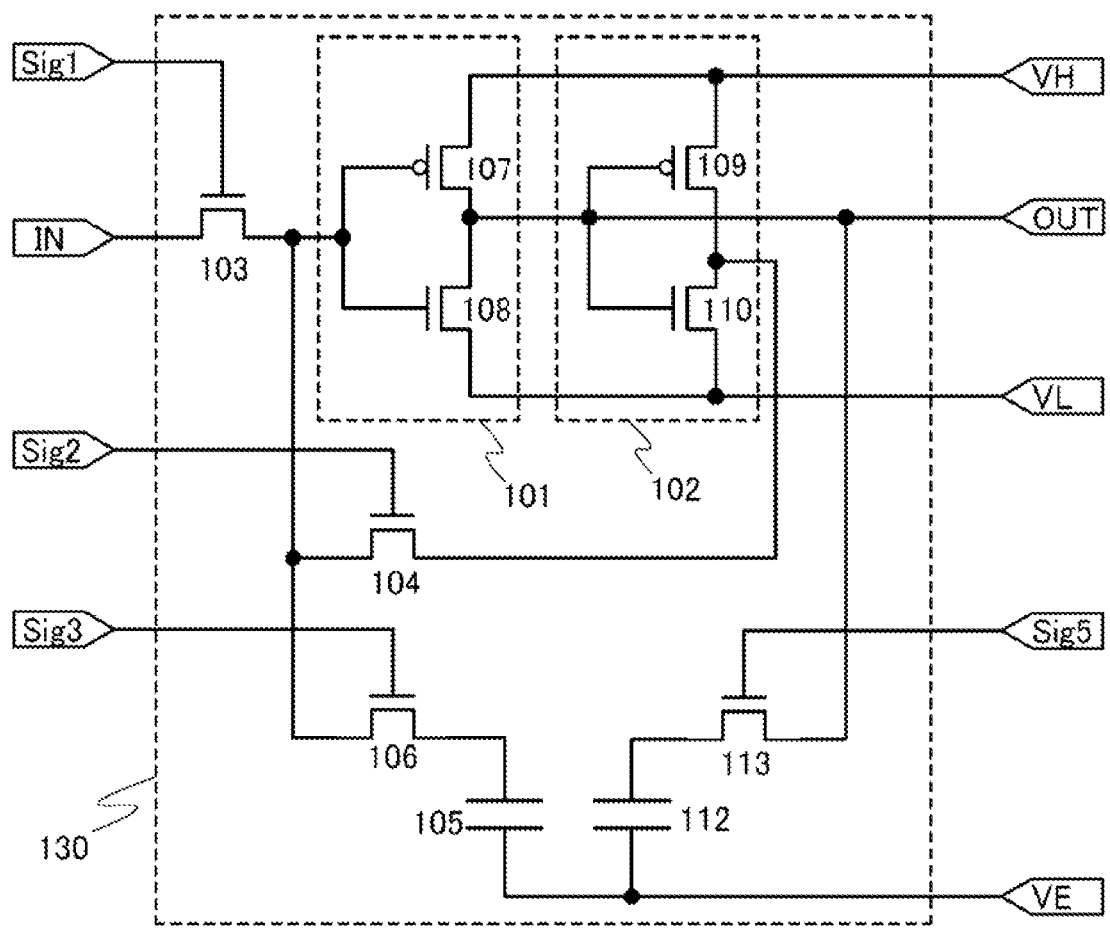

Next, an example of a specific circuit diagram of the memory element in FIG. 4A is illustrated in FIG. 4B. The memory element 130 in FIG. 4B includes at least the first phase-inversion element 101, the second phase-inversion element 102, the switching element 103, the switching element 104, the capacitor 105, the capacitor switching element 106, the capacitor 112, and the capacitor switching element 113. The connection structure of these circuit elements is the same as that in FIG. 4A. Embodiment 1 can be referred to for details of the first phase-inversion element 101 and the second phase-inversion element 102 in FIG. 4B.

In FIG. 4B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof Note that in FIG. 4B, a structure in which each of the switching element 103 and the switching element 104 includes only one transistor is illustrated; however, the present invention is not limited to this structure. In one embodiment of the present invention, the switching element 103 or the switching element 104 may include a plurality of transistors. In the case where a plurality of transistors which serve as switching elements are included in the switching element 103 or the switching element 104, the plurality of transistors may be connected to each other in parallel, in series, or in combination of parallel connection and series connection.

In FIG. 4B, a transistor including an oxide semiconductor in a channel formation region is used for the capacitor switching element 106, and the switching of the transistor is controlled by a signal Sig. 3 supplied to a gate electrode thereof. Since the transistor used for the capacitor switching element 106 includes a highly purified oxide semiconductor in a channel formation region, the amount of off-state current thereof is extremely small as described above.

In FIG. 4B, a transistor including an oxide semiconductor in a channel formation region is used for the capacitor switching element 113, and the switching of the transistor is controlled by a signal Sig. 5 supplied to a gate electrode thereof. Since the transistor used for the capacitor switching element 113 includes a highly purified oxide semiconductor in a channel formation region and has a sufficient long channel length, the amount of off-state current thereof is extremely small as described above.

Note that although the signal Sig. 3 and the signal Sig. 5 may be independently controlled, the signal Sig. 3 and the signal Sig. 5 may be controlled in synchronization because the capacitor switching element 106 and the capacitor switching element 113 operate at almost the same timing before stop of power supply and at data recovery. In the case where the signal Sig. 3 and the signal Sig. 5 are controlled in synchronization, circuit configuration can be simplified, which is preferable.

In FIG. 4B, a structure in which the capacitor switching element 106 or the capacitor switching element 113 includes only one transistor is illustrated; however, the present invention is not limited to this structure. In one embodiment of the present invention, the capacitor switching element 106 or the capacitor switching element 113 may include a plurality of transistors. In the case where a plurality of transistors which serve as switching elements are included in the capacitor switching element 106 or the capacitor switching element 113, the plurality of transistors may be connected to each other in parallel, in series, or in combination of parallel connection and series connection.

In this embodiment, at least a transistor used for a switching element in the capacitor switching element 106 or the capacitor switching element 113 includes a compound, e.g., a highly purified oxide semiconductor, in a channel formation region.

On the other hand, each of the transistors used for the first phase-inversion element 101, the second phase-inversion element 102, the switching element 103, and the switching element 104 can include a semiconductor other than an oxide semiconductor, e.g., an amorphous, microcrystalline, polycrystalline, or single crystal semiconductor can be used. As such a material of a semiconductor, silicon and germanium can be given.

The transistor may be manufactured with use of a thin semiconductor film or a bulk semiconductor wafer. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 4A or FIG. 4B is described. Note that the memory element can be operated by a method other than the following description.

First, in writing data, the switching element 103 is turned on, the switching element 104 is turned off, the capacitor switching element 106 is turned off, and the capacitor switching element 113 is turned off. Then, the potential VDD is supplied to the first node and the potential VSS is supplied to the second node, whereby power supply voltage is applied between the first node and the second node.

A potential of the signal N supplied to the memory element 130 is supplied to the input terminal of the first phase-inversion element 101 via the switching element 103, whereby the potential of the output terminal of the first phase-inversion element 101 is a phase-inverted potential of the signal N. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in the case where data is held by the first phase-inversion element 101 and the second phase-inversion element 102, in the state where the switching element 104 remains in an on-state, the capacitor switching element 106 and the capacitor switching element 113 remain in an off-state, the switching element 103 is turned off.

By turning off the switching element 103, the input data is held by the first phase-inversion element 101 and the second phase-inversion element 102. At this time, the potential VDD is supplied to the first node and the potential VSS is supplied to the second node, whereby the state in which the power supply voltage is applied between the first node and the second node is maintained.

The potential of the output terminal of the first phase-inversion element 101 reflects the data held by the first phase-inversion element 101 and the second phase-inversion element 102. Therefore, by reading out the potential, the data can be read out from the memory element 130.

Note that in the case where the input data is held by the capacitor 105 and the capacitor 112 in order to reduce power consumption in holding the data, the switching element 103 is turned off, the switching element 104 is turned on, the capacitor switching element 106 is turned on, and the capacitor switching element 113 is turned on.

Then, via the capacitor switching element 106, electric charge with an amount corresponding to the value of the data held by the first phase-inversion element 101 and the second phase-inversion element 102 is stored in the capacitor 105, whereby the data is written into the capacitor 105. Further, via the capacitor switching element 113, electric charge with an amount corresponding to the value of the data held by the first phase-inversion element 101 and the second phase-inversion element 102 is stored in the capacitor 112, whereby the data is written into the capacitor 112.

After the data is stored in the capacitor 105, the capacitor switching element 106 is turned off, whereby the data stored in the capacitor 105 is held. In addition, after the data is stored in the capacitor 112, the capacitor switching element 113 is turned off, whereby the data stored in the capacitor 112 is held. After turning off the capacitor switching element 106 and the capacitor switching element 113, the potential VSS, for example, is applied to the first node and the second node so that the nodes have equal potentials, and the application of the power supply voltage between the first node and the second node is stopped.

In such a manner, in the case where the input data is held by the capacitor 105 and the capacitor 112, the application of the power supply voltage between the first node and the second node is unnecessary; therefore, the off-state current flowing between the first node and the second node via the p-channel transistor 107 and the n-channel transistor 108 which are included in the first phase-inversion element 101, or via the p-channel transistor 109 and the n-channel transistor 110 which are included in the second phase-inversion element 102 can be extremely close to zero.

As a result, power consumption due to the off-state current of the memory element in holding data can be significantly reduced, and accordingly the power consumption of the memory device and further the signal processing circuit including the memory device can be suppressed to be low.

Since the transistor used for the capacitor switching element 106 and the capacitor switching element 113 includes a highly-purified oxide semiconductor in a channel formation region, the off-state current density can be less than or equal to 100 zA/μm, preferably less than or equal to 10 zA/μm, further preferably less than or equal to 1 zA/μm.

Accordingly, the transistor including a highly purified oxide semiconductor film as an active layer has far lower off-state current than a transistor including silicon having crystallinity. As a result, when the capacitor switching element 106 for which the above transistor is used is off, charge stored in the capacitor 105 is hardly released; therefore, the data is held. In addition, when the capacitor switching element 113 for which the above transistor is used is off, charge stored in the capacitor 112 is hardly released; therefore, the data is held.

Note that in order to recover data stored in the capacitor 105 and the capacitor 112, steps of precharge, discharge, and amplification are performed as in Embodiment 1. In the memory element of this embodiment, the first phase-inversion element 101 is provided with the capacitor switching element 106 and the capacitor 105, and the second phase-inversion element 102 is provided with the capacitor switching element 113 and the capacitor 112. In accordance with characteristics of the circuit, different data is held in the respective capacitors (when charge of high level potential is held in one capacitor, charge of low level potential is held in the other capacitor).

Consequently, regardless of the value of the precharge potential, a potential difference in accordance with data is constantly generated between the input terminal of the first phase-inversion element 101 and the input terminal of the second phase-inversion element 102. Therefore, there is less restriction on the precharge potential as compared with those in Embodiment 1. For example, the precharge potential can be set to 0V. Note that when amplification is performed for a short period of time, the precharge potential may be set to an appropriate potential.

After the precharge is completed, the switching element 103 is turned off. Discharge and amplification may be performed in the manner described in Embodiment 1. Note that although thin film transistors formed with use of a highly purified oxide semiconductor is used as the capacitor switching elements 106 and 113 in the above, thin film transistors formed with use of, for example, amorphous silicon, polysilicon, or microcrystalline silicon may be used.

The matter disclosed in this embodiment can be implemented in appropriate combination with the matter described in the other embodiments.

Embodiment 4

Figure 5A:
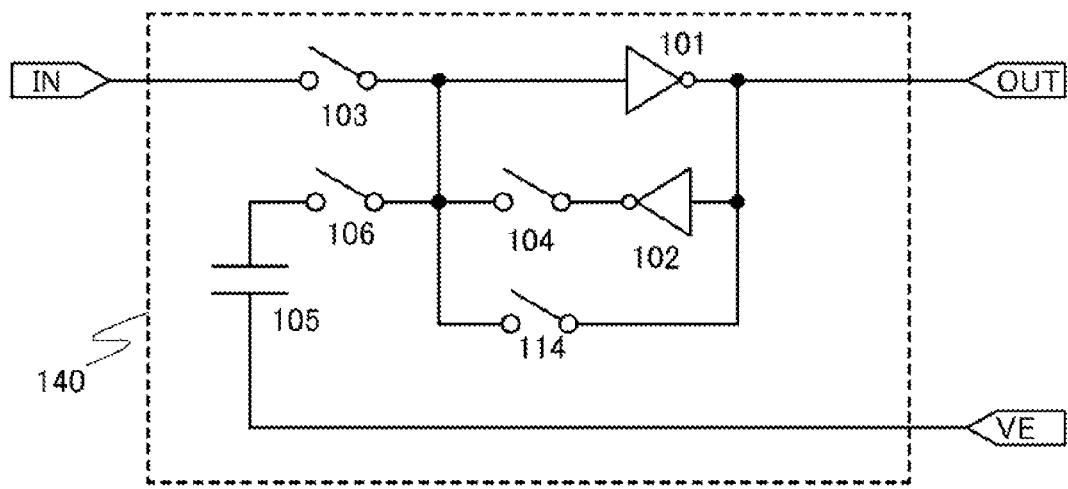
FIGS. 5A and 5B are circuit diagrams of a memory element.

In this embodiment, another example of a memory element included in a memory device of the present invention will be described. FIG. 5A is a circuit diagram illustrating an example of a memory element of this embodiment.

A memory element 140 illustrated in FIG. 5A at least includes a first phase-inversion element 101 and a second phase-inversion element 102 by which the phase of an input signal is inverted and the signal is output, a switching element 103, a switching element 104, a capacitor 105, and a capacitor switching element 106.

The memory element 140 also includes a switching element 114. The switching element 114 is provided between the input terminal of the first phase-inversion element 101 and the input terminal of the second phase-inversion element 102, and controlled by a signal Sig. 6.

A signal IN including data that is input to the memory element 140 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. The potential of the output terminal of the first phase-inversion element 101 or the potential of the input terminal of the second phase-inversion element 102 is output to a memory element or another circuit of a subsequent stage as a signal OUT.

The capacitor 105 is connected to an input terminal of the memory element 140, i.e., a node to which a potential of the signal IN is supplied, via the switching element 103 and the capacitor switching element 106 so that the data of the signal IN that is input to the memory element 140 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

Note that in FIG. 5A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

For the capacitor switching element 106, a transistor including a highly purified oxide semiconductor in a channel formation region is used. Like the capacitor switching element 106 in Embodiment 1, the capacitor switching element 106 is formed above the first phase-inversion element 101 and the second phase-inversion element 102 with use of an oxide semiconductor, and the channel length is greater than or equal to 10 F, preferably greater than or equal to 20 F, further preferably greater than or equal to 50 F.

Note that the memory element 140 may further include another circuit element such as a diode, a resistor, an inductor, or a capacitor, as needed.

Figure 5B:
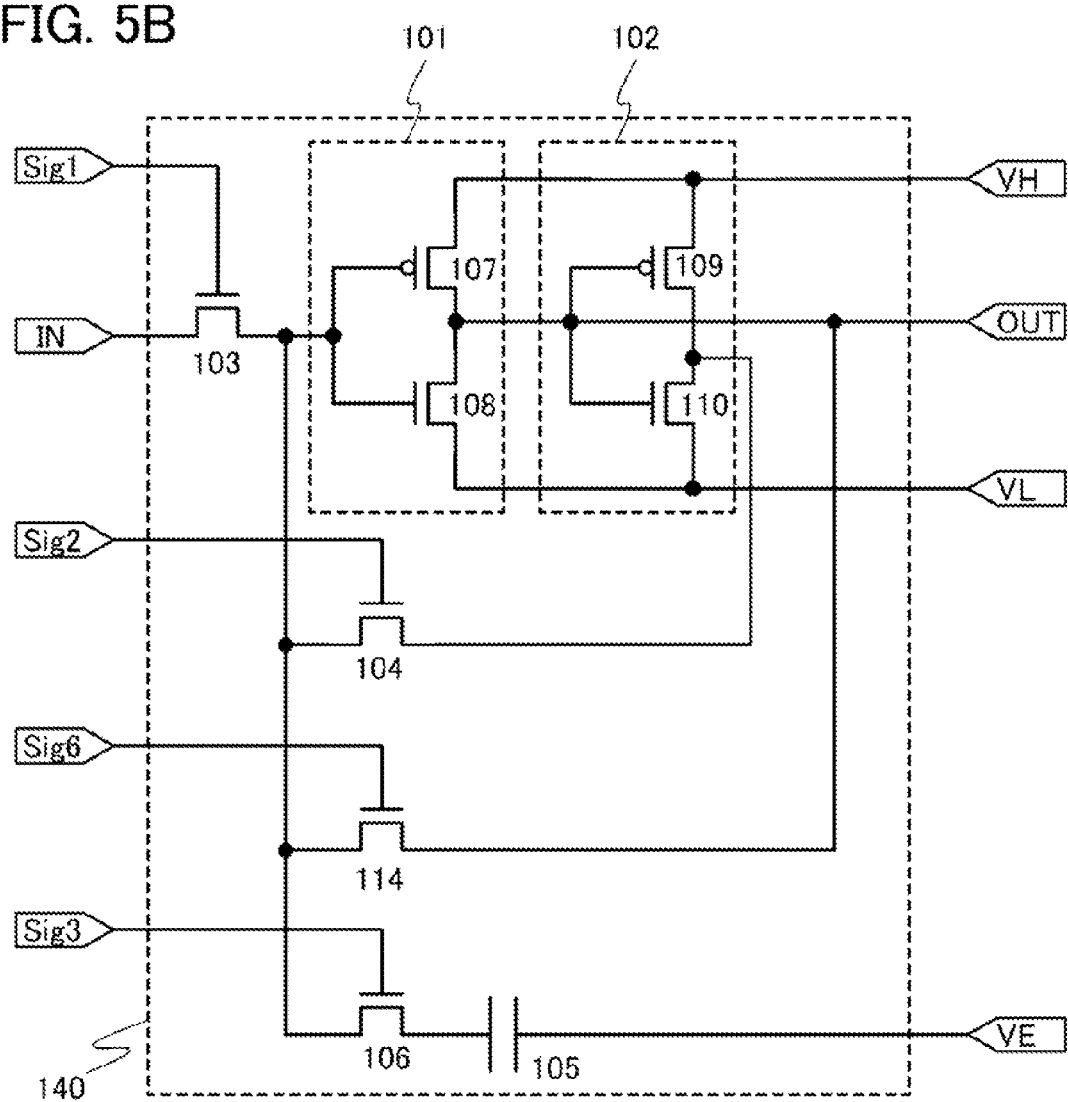

Next, an example of a specific circuit diagram of the memory element in FIG. 5A is illustrated in FIG. 5B. The memory element 140 in FIG. 5B includes at least the first phase-inversion element 101, the second phase-inversion element 102, the switching element 103, the switching element 104, the capacitor 105, the capacitor switching element 106, and the switching element 114. The connection structure of these circuit elements is the same as that in FIG. 5A. Embodiment 1 can be referred to for details of the first phase-inversion element 101 and the second phase-inversion element 102 in FIG. 5B.

In FIG. 5B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof. Further, the case where one transistor is used for the switching element 114 is illustrated as an example, and the switching of this transistor is controlled by a signal Sig. 6 supplied to a gate electrode thereof.

Note that in FIG. 5B, a structure in which each of the switching element 103, the switching element 104, and the switching element 114 includes only one transistor is illustrated; however, the present invention is not limited to this structure. In one embodiment of the present invention, the switching element 103, the switching element 104, or the switching element 114 may include a plurality of transistors. In the case where a plurality of transistors which serve as switching elements are included in the switching element 103, the switching element 104, or the switching element 114, the plurality of transistors may be connected to each other in parallel, in series, or in combination of parallel connection and series connection.

In FIG. 5B, a transistor including an oxide semiconductor in a channel formation region is used for the capacitor switching element 106, and the switching of the transistor is controlled by a signal Sig. 3 supplied to a gate electrode thereof. Since the transistor used for the capacitor switching element 106 includes a highly purified oxide semiconductor in a channel formation region, the amount of off-state current thereof is extremely small as described above.

Note that in FIG. 5B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 includes a highly purified oxide semiconductor in a channel formation region. Each of the transistors used for the first phase-inversion element 101, the second phase-inversion element 102, the switching element 103, the switching element 104, and the switching element 114 can include a semiconductor other than an oxide semiconductor, e.g., an amorphous, microcrystalline, polycrystalline, or single crystal semiconductor can be used. As such a material of a semiconductor, silicon and germanium can be given.

The transistor may be manufactured with use of a thin semiconductor film or a bulk semiconductor wafer. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 5A or FIG. 5B is described. Note that the memory element can be operated by a method other than the following description. The switching element 114 is turned off in order to operate data writing, data retention by the first phase-inversion element 101 and the second phase-inversion element 102, and input data retention by the capacitor 105. Details are the same as those in Embodiment 1 and thus omitted.

In order to recover data stored in the capacitor 105, steps of precharge, discharge, and amplification are performed as in Embodiment 1. A step of precharge differs from the process of precharge in Embodiment 1. In the memory element 140 of this embodiment, the signal IN, the first node, and the second node are at least set to the precharge potential.

Then, the switching element 103, the switching element 104, and the switching element 114 are turned on. As a result, in addition to the input terminal of the first phase-inversion element 101, the input and output terminals of the second phase-inversion element 102 can be the precharge potential rapidly (within one microsecond).

After that, the switching element 103 and the switching element 114 are turned off. Discharge and amplification may be performed in the manner described in Embodiment 1. Note that although a thin film transistor formed with use of a highly purified oxide semiconductor is used as the capacitor switching element 106 in the above, a thin film transistor formed with use of, for example, amorphous silicon, polysilicon, or microcrystalline silicon may be used.

The matter disclosed in this embodiment can be implemented in appropriate combination with the matter described in the other embodiments.

Embodiment 5

Figure 6A:
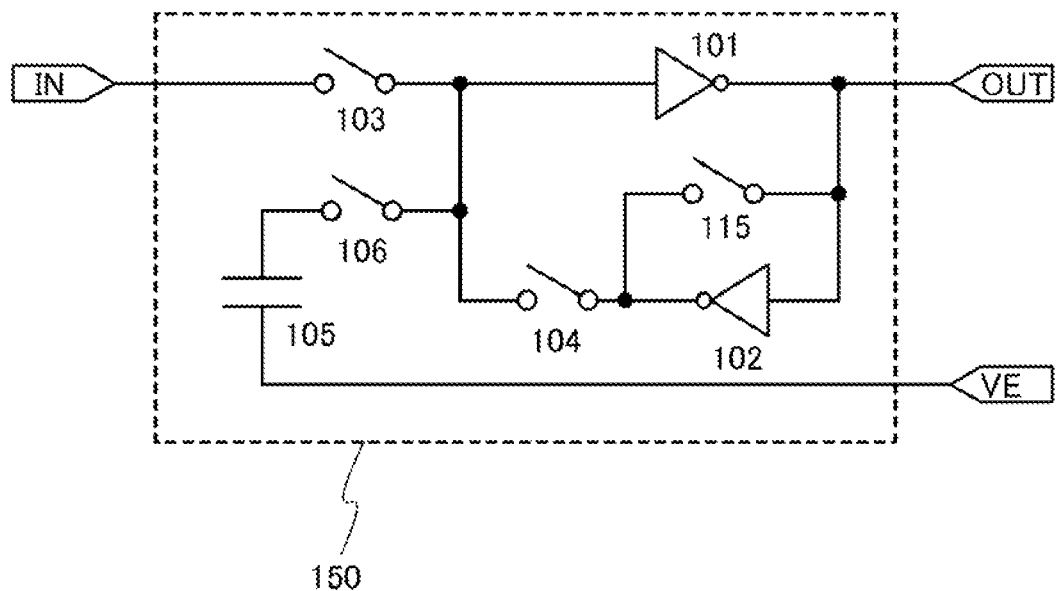
FIGS. 6A and 6B are circuit diagrams of a memory element.

In this embodiment, another example of a memory element included in a memory device of the present invention will be described. FIG. 6A is a circuit diagram illustrating an example of a memory element of this embodiment.

A memory element 150 illustrated in FIG. 6A at least includes a first phase-inversion element 101 and a second phase-inversion element 102 by which the phase of an input signal is inverted and the signal is output, a switching element 103, a switching element 104, a capacitor 105, a capacitor switching element 106, and a switching element 115.

A signal IN including data that is input to the memory element 150 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. The potential of the output terminal of the first phase-inversion element 101 or the potential of the input terminal of the second phase-inversion element 102 is output to a memory element or another circuit of a subsequent stage as a signal OUT.

The output terminal of the first phase-inversion element 101 is connected to the output terminal of the second phase-inversion element 102 through the switching element 115.

The capacitor 105 is connected to an input terminal of the memory element 150, i.e., a node to which a potential of the signal IN is supplied, via the switching element 103 and the capacitor switching element 106 so that the data of the signal IN that is input to the memory element 150 can be stored as needed.

Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

Note that in FIG. 6A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

For the capacitor switching element 106, a transistor including a highly purified oxide semiconductor in a channel formation region is used. Like the capacitor switching element 106 in Embodiment 1, the capacitor switching element 106 is formed above the first phase-inversion element 101 and the second phase-inversion element 102 with use of an oxide semiconductor, and the channel length is greater than or equal to 10 F, preferably greater than or equal to 20 F, further preferably greater than or equal to 50 F.

Note that the memory element 150 may further include another circuit element such as a diode, a resistor, an inductor, or a capacitor, as needed.

Figure 6B:
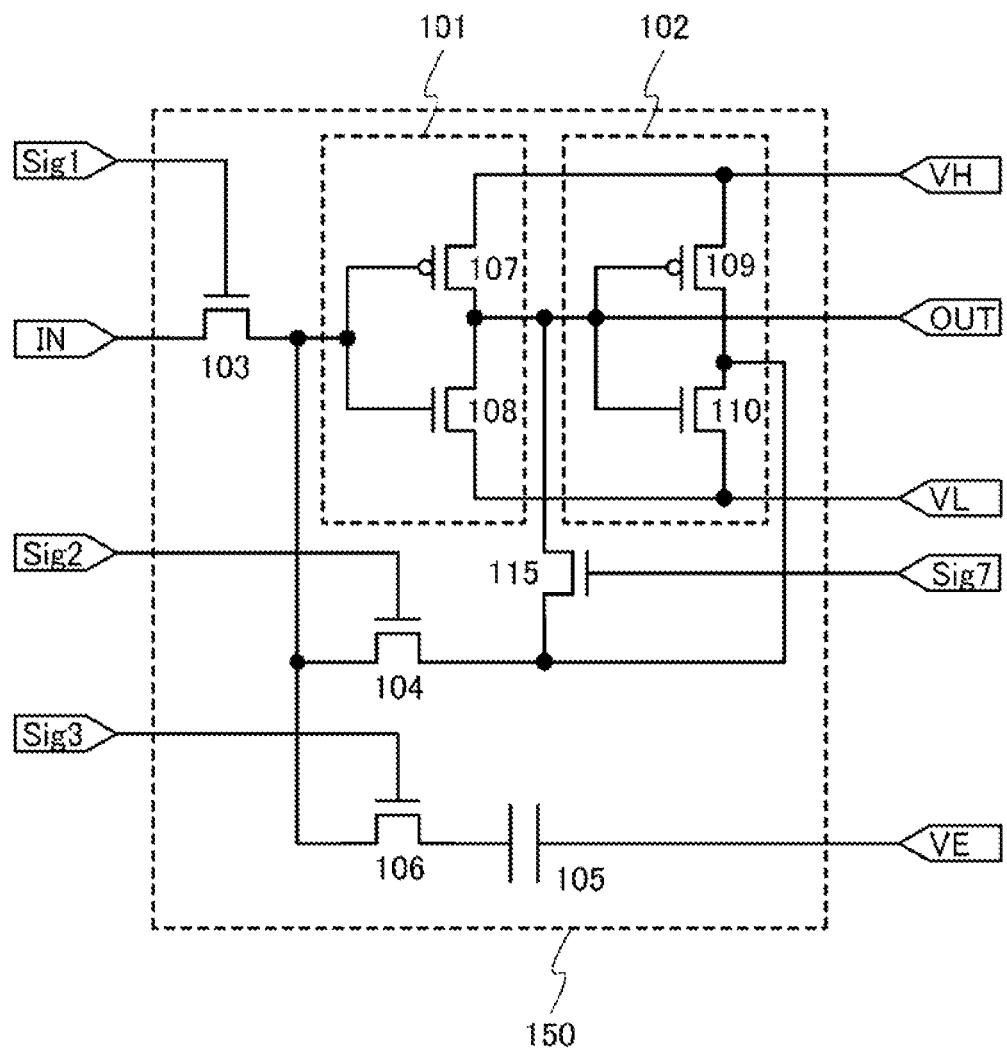

Next, an example of a specific circuit diagram of the memory element in FIG. 6A is illustrated in FIG. 6B. The memory element 150 in FIG. 6B includes at least the first phase-inversion element 101, the second phase-inversion element 102, the switching element 103, the switching element 104, the capacitor 105, the capacitor switching element 106, and the switching element 115. The connection structure of these circuit elements is the same as that in FIG. 6A. Embodiment 1 can be referred to for details of the first phase-inversion element 101 and the second phase-inversion element 102 in FIG. 6B.

In FIG. 6B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof. Further, the case where one transistor is used for the switching element 115 is illustrated as an example, and the switching of this transistor is controlled by a signal Sig. 7 supplied to a gate electrode thereof.

Note that in FIG. 6B, a structure in which each of the switching element 103, the switching element 104, and the switching element 115 includes only one transistor is illustrated; however, the present invention is not limited to this structure. In one embodiment of the present invention, the switching element 103, the switching element 104, or the switching element 115 may include a plurality of transistors. In the case where a plurality of transistors which serve as switching elements are included in the switching element 103, the switching element 104, or the switching element 115, the plurality of transistors may be connected to each other in parallel, in series, or in combination of parallel connection and series connection.

In FIG. 6B, a transistor including an oxide semiconductor in a channel formation region is used for the capacitor switching element 106, and the switching of the transistor is controlled by a signal Sig. 3 supplied to a gate electrode thereof. Since the transistor used for the capacitor switching element 106 includes a highly purified oxide semiconductor in a channel formation region, the amount of off-state current thereof is extremely small as described above.

Note that in FIG. 6B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 includes a highly purified oxide semiconductor in a channel formation region. Each of the transistors used for the first phase-inversion element 101, the second phase-inversion element 102, the switching element 103, the switching element 104, and the switching element 115 can include a semiconductor other than an oxide semiconductor, e.g., an amorphous, microcrystalline, polycrystalline, or single crystal semiconductor can be used. As such a material of a semiconductor, silicon and germanium can be given.

The transistor may be manufactured with use of a thin semiconductor film or a bulk semiconductor wafer. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 6A or FIG. 6B is described. Note that the memory element can be operated by a method other than the following description. Since data writing, input data retention, data writing to the capacitor 105, and the like are the same as those in Embodiment 1, description thereof is omitted, and data recovery will be described below.

In order to recover data stored in the capacitor 105, steps of precharge, discharge, and amplification are performed as in Embodiment 1. In the step of precharge, the switching element 103, the switching element 104, and the switching element 115 are turned on, and at least the signal IN, the potential of the first node, and the potential of the second node are set to the precharge potential.

Since the switching element 115 is turned on here, the potential of the input terminal of the second phase-inversion element 102 becomes the precharge potential rapidly (within one microsecond).

After that, the switching element 103 and the switching element 115 are turned off. Discharge and amplification may be performed in the manner described in Embodiment 1. Note that although a thin film transistor formed with use of a highly purified oxide semiconductor is used as the capacitor switching element 106 in the above, a thin film transistor formed with use of, for example, amorphous silicon, polysilicon, or microcrystalline silicon may be used.

The matter disclosed in this embodiment can be implemented in appropriate combination with the matter described in the other embodiments.

Embodiment 6

Figure 9A:
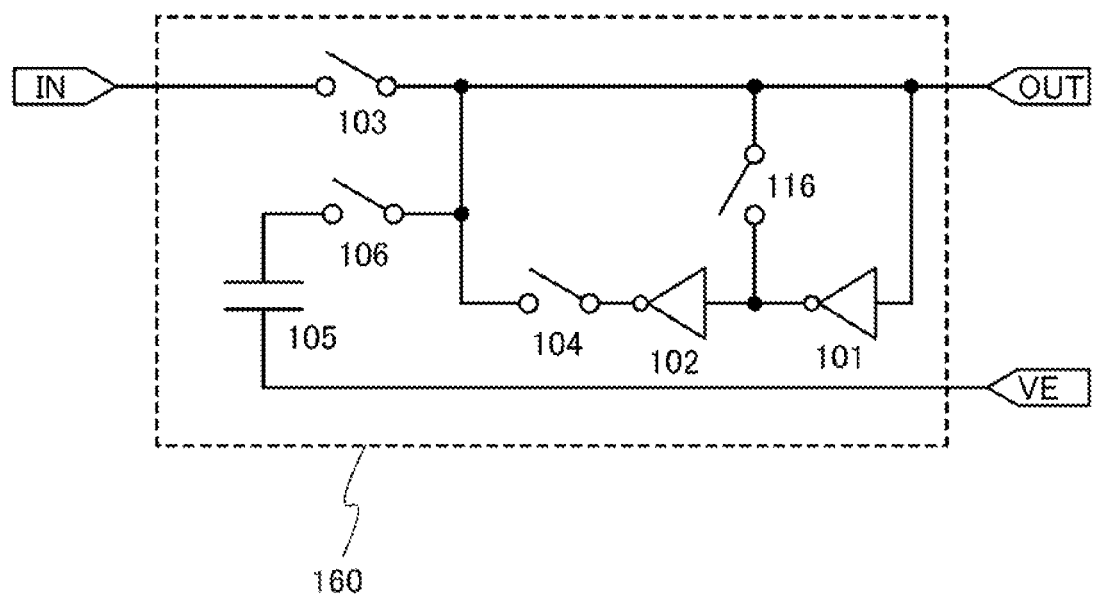
FIGS. 9A and 9B are circuit diagrams of memory elements.

In this embodiment, another example of a memory element included in a memory device of the present invention will be described. FIG. 9A is a circuit diagram illustrating an example of a memory element of this embodiment.

A memory element 160 illustrated in FIG. 9A at least includes a first phase-inversion element 101 and a second phase-inversion element 102 by which the phase of an input signal is inverted and the signal is output, a switching element 103, a switching element 104, a capacitor 105, a capacitor switching element 106, and a switching element 116.

A signal IN including data that is input to the memory element 160 is supplied to an input terminal of the first phase-inversion element 101 via the switching element 103. An output terminal of the first phase-inversion element 101 is connected to an input terminal of the second phase-inversion element 102. The output terminal of the second phase-inversion element 102 is connected to the input terminal of the first phase-inversion element 101 through the switching element 104, and the potential of the output terminal of the second phase-inversion element 102 is output to a memory element or to another circuit of a subsequent stage as the signal OUT.

An output terminal of the first phase-inversion element 101 is connected to the input terminal of the first phase-inversion element 101 via the switching element 116.

The capacitor 105 is connected to an input terminal of the memory element 160, i.e., a node to which a potential of the signal IN is supplied, via the switching element 103 and the capacitor switching element 106 so that the data of the signal IN that is input to the memory element 160 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

Note that in FIG. 9A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

For the capacitor switching element 106, a transistor including a highly purified oxide semiconductor in a channel formation region is used. Like the capacitor switching element 106 in Embodiment 1, the capacitor switching element 106 is formed above the first phase-inversion element 101 and the second phase-inversion element 102 with use of an oxide semiconductor, and the channel length is greater than or equal to 10 F, preferably greater than or equal to 20 F, further preferably greater than or equal to 50 F.

Note that the memory element 160 may further include another circuit element such as a diode, a resistor, an inductor, or a capacitor as needed.

In FIG. 9A, a transistor including a highly purified oxide semiconductor in the channel formation region is used as the capacitor switching element 106, so that the off-state current of the transistor is extremely low as described above. The capacitor switching element 106 may include one transistor or a plurality of transistors.

In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 includes a highly purified oxide semiconductor in a channel formation region. Each of the transistors used for the first phase-inversion element 101, the second phase-inversion element 102, the switching element 103, the switching element 104, and the switching element 116 can include a semiconductor other than an oxide semiconductor, e.g., an amorphous, microcrystalline, polycrystalline, or single crystal semiconductor can be used. As such a material of a semiconductor, silicon and germanium can be given.

The transistor may be manufactured with use of a thin semiconductor film or a bulk semiconductor wafer. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 9A is described. Note that the memory element can be operated by a method other than the following description. Since data writing, input data retention, data writing to the capacitor 105, and the like are the same as those in Embodiment 1, description thereof is omitted, and data recovery will be described below.

In order to recover data stored in the capacitor 105, steps of precharge, discharge, and amplification are performed as in Embodiment 1. In the step of precharge, the switching element 103, the switching element 104, and the switching element 116 are turned on, and at least the signal IN, the potential of the first node, and the potential of the second node are set to the precharge potential.

Since the switching element 116 is turned on here, the potential of the input terminal of the second phase-inversion element 102 becomes the precharge potential rapidly (within one microsecond). Given that the switching element 116 is not provided in the circuit; both the first node and the second node of the first phase-inversion element 101 and the second phase-inversion element 102 are kept at the low-level potential VSS; and the output terminal and the input terminal of the second phase-inversion element 102 are not electrically connected to each other, it takes several milliseconds or more to set the input terminal of the second phase-inversion element 102 to the precharge potential after the first node and the second node are set to the precharge potential.

After that, the switching element 103 and the switching element 116 are turned off. Discharge and amplification may be performed in the manner described in Embodiment 1. Note that although a thin film transistor formed with use of a highly purified oxide semiconductor is used as the capacitor switching element 106 in the above, a thin film transistor formed with use of, for example, amorphous silicon, polysilicon, or microcrystalline silicon may be used.

The matter disclosed in this embodiment can be implemented in appropriate combination with the matter described in the other embodiments.

Embodiment 7

Figure 9B:
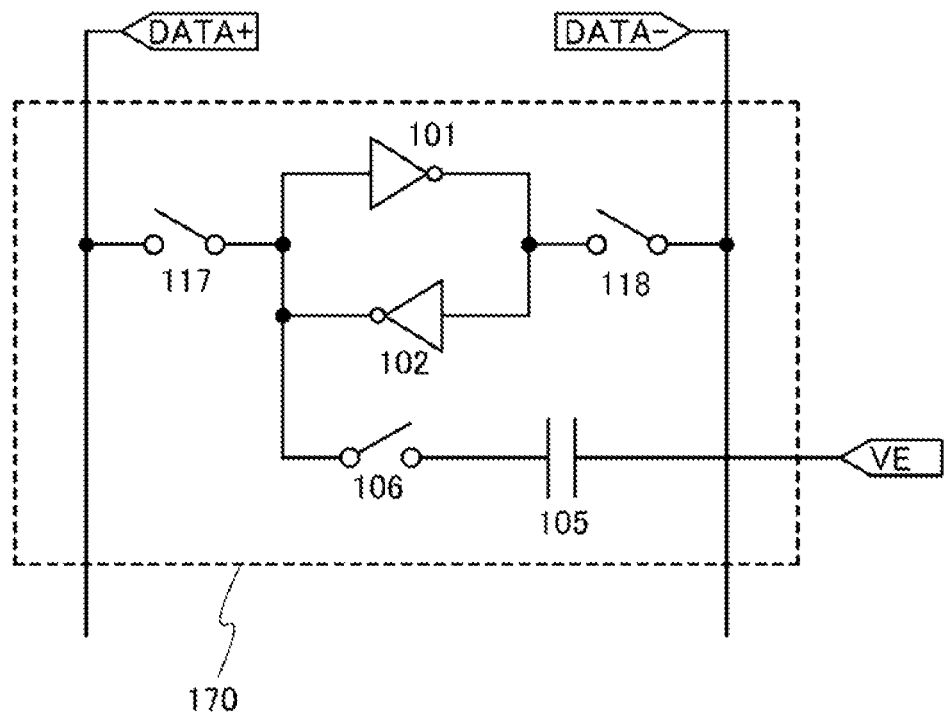

In this embodiment, an SRAM will be described as another example of the present invention. FIG. 9B is a circuit diagram illustrating a memory element of this embodiment. A memory element 170 illustrated in FIG. 9B at least includes a first phase-inversion element 101 and a second phase-inversion element 102 by which the phase of an input signal is inverted and the signal is output, a switching element 117, a switching element 118, a capacitor 105, and a capacitor switching element 106.

The output terminal of the first phase-inversion element 101 is connected to the input terminal of the second phase-inversion element 102. The output terminal of the second phase-inversion element 102 is connected to the input terminal of the first phase-inversion element 101. Signal DATA+ including input-output data of the memory element 170 is supplied to the input terminal of the first phase-inversion element 101 through the switching element 117. Signal DATA− is supplied to the input terminal of the second phase-inversion element 102 through the switching element 118. Reversely, signal DATA− is output from the output terminal of the first phase-inversion element 101 through the switching element 118, and signal DATA+ is output from the output terminal of the second phase-inversion element 102 through the switching element 117.

The capacitor 105 is connected to a node to which a potential of a signal DATA+ is supplied, via the switching element 117 and the capacitor switching element 106 so that the data that is input to the memory element 170 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a potential VE such as a ground potential is supplied.

For the capacitor switching element 106, a transistor including a highly purified oxide semiconductor in a channel formation region is used. Like the capacitor switching element 106 in Embodiment 1, the capacitor switching element 106 is formed above the first phase-inversion element 101 and the second phase-inversion element 102 with use of an oxide semiconductor, and the channel length is greater than or equal to 10 F, preferably greater than or equal to 20 F, further preferably greater than or equal to 50 F.

Note that the memory element 170 may further include another circuit element such as a diode, a resistor, an inductor, or capacitor as needed.

In FIG. 9B, a transistor including a highly purified oxide semiconductor in the channel formation region is used as the capacitor switching element 106, so that the off-state current of the transistor is extremely low as described above. The capacitor switching element 106 may include one transistor or a plurality of transistors.

In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 includes a highly purified oxide semiconductor in a channel formation region. Each of the transistors used for the first phase-inversion element 101, the second phase-inversion element 102, the switching element 117, and the switching element 118, can include a semiconductor other than an oxide semiconductor, e.g., an amorphous, microcrystalline, polycrystalline, or single crystal semiconductor can be used. As such a material of a semiconductor, silicon and germanium can be given.

The transistor may be manufactured with use of a thin semiconductor film or a bulk semiconductor wafer. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 9B is described. Note that the memory element can be operated by a method other than the following description. A method of data writing and input data retention is the same as the known method for driving SRAM except for that the capacitor switching element 106 is turned off.

Data writing to the capacitor 105 is performed in a state where the memory element 170 holds data. At this time, the switching element 117 and the switching element 118 are turned off. In that state, the capacitor switching element 106 is turned on and kept on for an appropriate period of time, whereby charge corresponding to data is stored in the capacitor 105. After that, the capacitor switching element 106 is turned off. Further, the first node and the second node are made to have the same potential.

Next, a method for recovering data will be described. In order to recover data stored in the capacitor 105, steps of precharge, discharge, and amplification are performed as in Embodiment 1. In the step of precharge, the switching element 117 and the switching element 118 are turned on, and at least the signal DATA+, the signal DATA−, the potential of the first node, and the potential of the second node are set to the precharge potential.

After that, the switching element 117 and the switching element 118 are turned off. Discharge and amplification may be performed in the manner described in Embodiment 1. Note that although a thin film transistor formed with use of a highly purified oxide semiconductor is used as the capacitor switching element 106 in the above, a thin film transistor formed with use of, for example, amorphous silicon, polysilicon, or microcrystalline silicon may be used.

The matter disclosed in this embodiment can be implemented in appropriate combination with the matter described in the other embodiments.

Embodiment 8

Figure 12A:
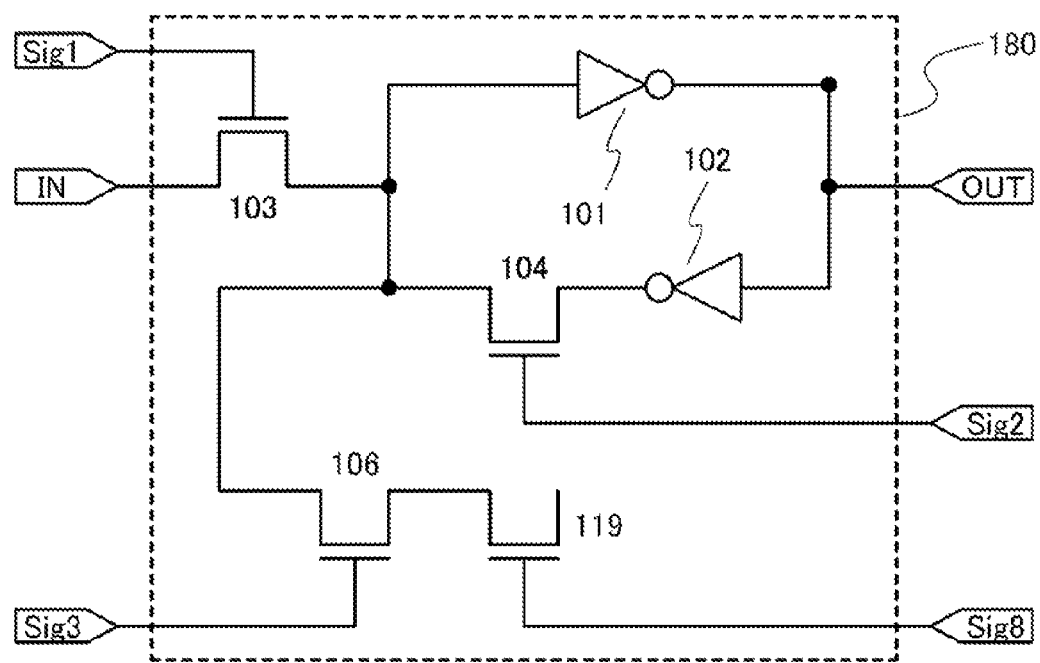
FIGS. 12A and 12B are a circuit diagram and a cross-sectional view of a memory element.

In this embodiment, another example of a memory element included in a memory device of the present invention will be described. FIG. 12A is a circuit diagram illustrating a memory element of this embodiment. A memory element 180 of this embodiment has a circuit configuration similar to that of the memory element 100 in FIGS. 1A and 1B, and includes an MIS-type capacitor 119 instead of the capacitor 105. The MIS-type capacitor 119 has a structure in which a dielectric is provided between a gate electrode and a semiconductor layer.

Figure 12B:
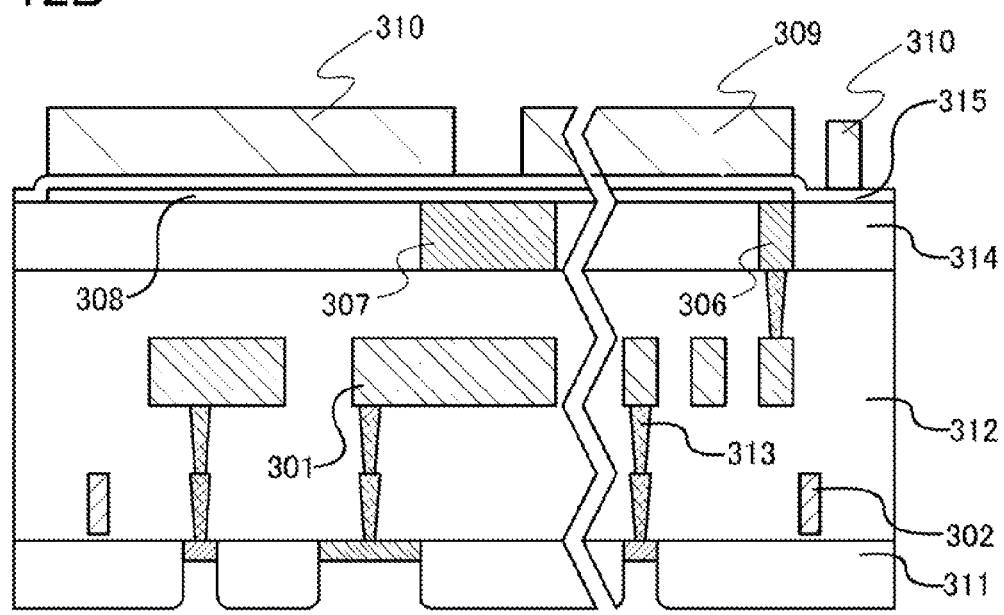
Figure 13A:
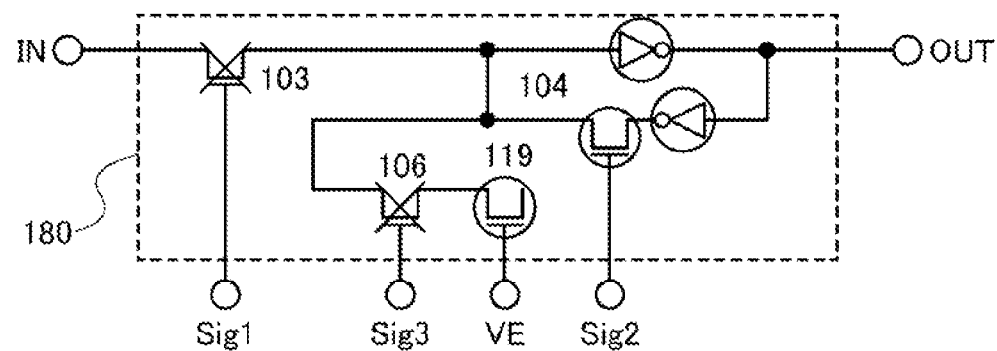
FIGS. 13A to 13C are diagrams illustrating operation examples of a memory element.
Figure 13B:
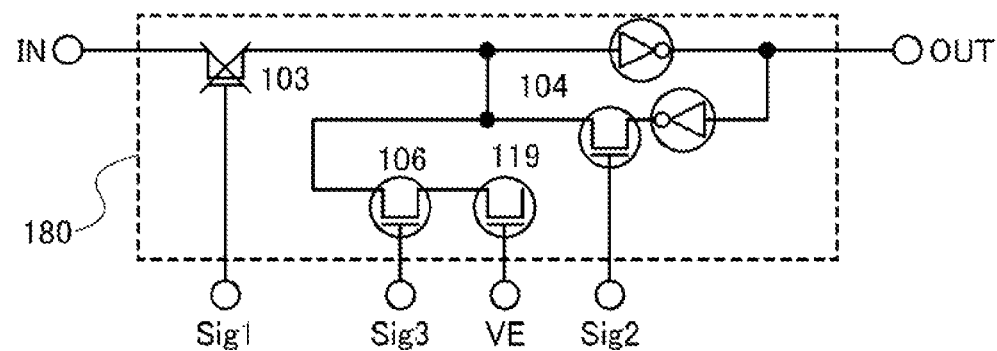
Figure 13C:
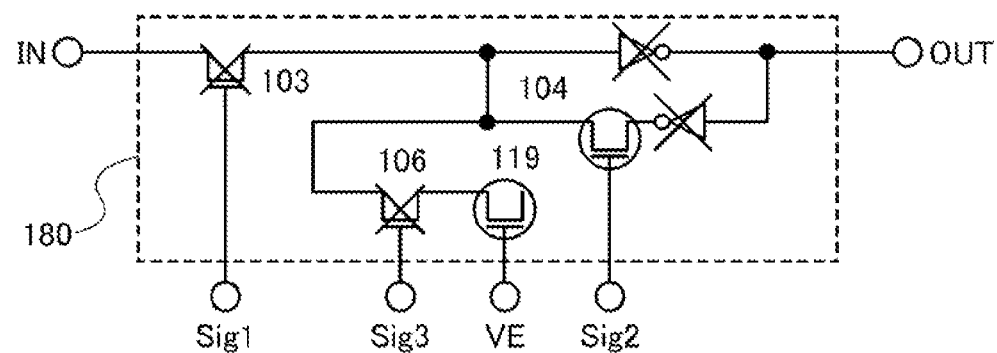
Figure 14A:
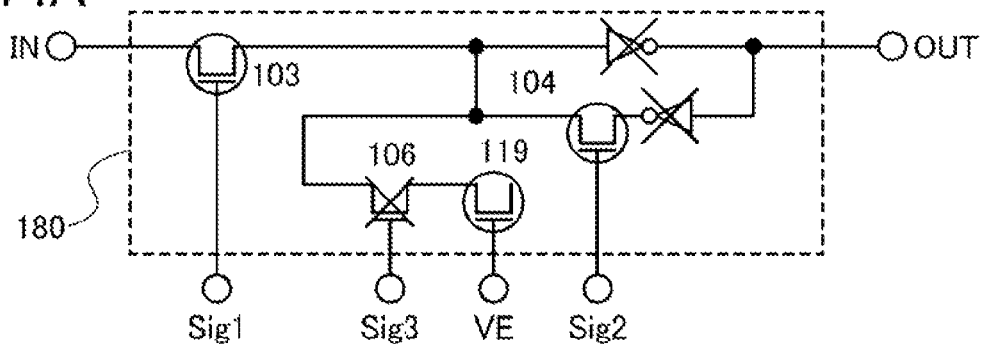
FIGS. 14A to 14D are diagrams illustrating operation examples of a memory element.
Figure 14B:
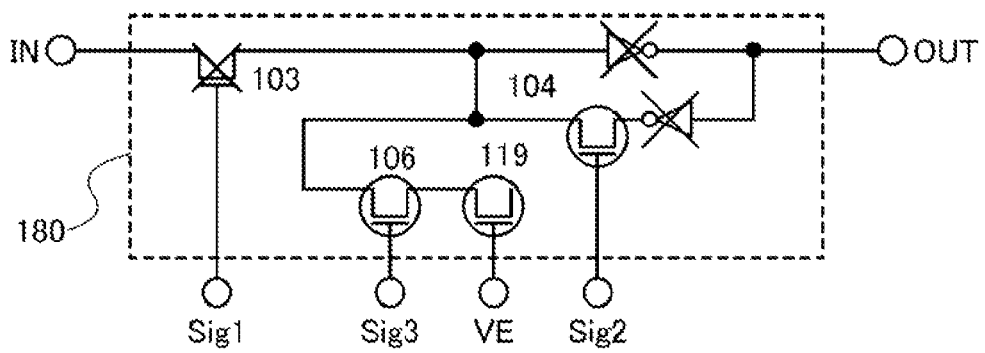
Figure 14C:
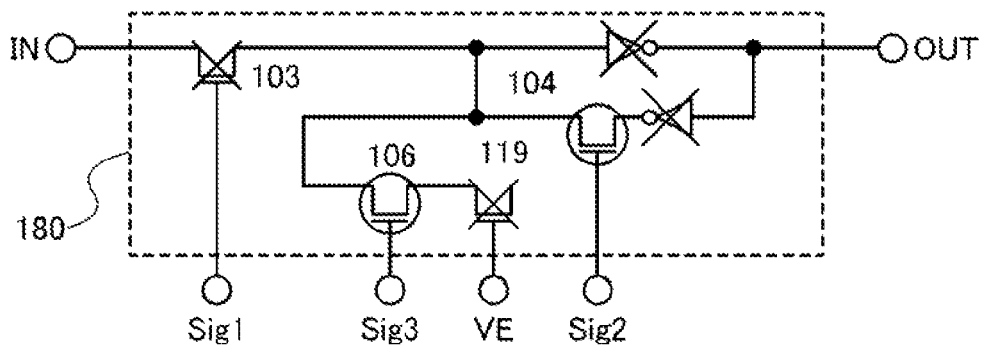
Figure 14D:
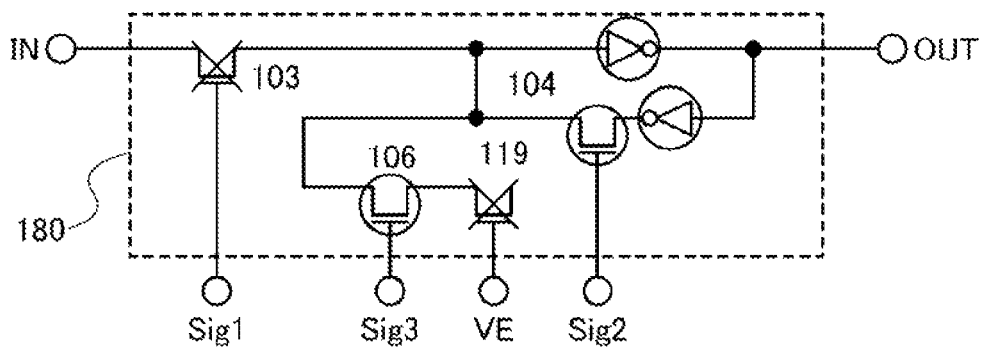

FIG. 12B is a schematic cross-sectional view of the memory element of this embodiment. This cross-sectional view corresponds to FIG. 8B. Note that although the memory element in FIG. 12B includes components the same as those of the memory element in FIGS. 7A to 7D and FIGS. 8A and 8B, layouts of the source electrode 307 and the oxide semiconductor region 308 in FIG. 12B are different from those in FIGS. 7A to 7D and FIGS. 8A and 8B. In this embodiment, capacitance is formed mainly between the oxide semiconductor region 308 and the capacitor wiring 310. On the other hand, in the memory element in FIGS. 7A to 7D and FIGS. 8A and 8B, capacitance is formed mainly between the source electrode 307 and the capacitor wiring 310.

The capacitance of the MIS-type capacitor 119 can be changed in accordance with the potential of the gate electrode (capacitor wiring 310 in this embodiment). For example, in the process of discharge, most of all charge stored can be released by making the capacitance of the MIS-type capacitor 119 to be extremely small.

In order to form the memory element of this embodiment, for example, the most part of the source electrode 307 in FIG. 7B is not formed and instead, the oxide semiconductor region 308 in FIG. 7C may be formed to overlap with the part. In other words, the MIS-type capacitor can be formed by only changing the layouts of the source electrode 307 and the oxide semiconductor region 308.

Next, an example of the operation of the memory element 180 of this embodiment is described with reference to FIGS. 13A to 13C and FIGS. 14A to 14D. Note that the memory element can be operated by a method other than the following description. Note that in FIGS. 13A to 13C and FIGS. 14A to 14D, transistors in an on-state, phase-inversion circuits in an active state, and MIS-type capacitors with the maximum capacitance are marked with a circle, and transistors in an off-state, phase-inversion circuits in a non-active state, and MIS-type capacitors with the minimum capacitance are marked with a cross.

<FIG. 13A>

Data is held in the memory element 180. At this time, the switching element 103 and the capacitor switching element 106 are in an off-state and the switching element 104 is in an on-state. The capacitance of the MIS-type capacitor 119 is the maximum capacitance.

<FIG. 13B>

The capacitor switching element 106 is turned on. As a result, charge corresponding to data is stored in the MIS-type capacitor 119.

<FIG. 13C>

Then, the switching element 104 and the capacitor switching element 106 are turned off. The first node and the second node of the first phase-inversion element and the second phase-inversion element are set to the same potential. Note that the switching element 104 may be kept on. In the above manner, the first phase-inversion element and the second phase-inversion element are deactivated. Data which has been stored in the first phase-inversion element and the second phase-inversion element can be held in the MIS-type capacitor 119.

<FIG. 14A>

Precharge is performed. Embodiment 1 can be referred to for the details.

<FIG. 14B>

The switching element 103 is turned off. Further, the capacitor switching element 106 is turned on. As a result, the potential of the input terminal of the first phase-inversion element varies in accordance with the stored data.

<FIG. 14C>

The capacitance of the MIS-type capacitor 119 is made to be the minimum capacitance. As a result, the potential of the input terminal of the first phase-inversion element varies more significantly.

<FIG. 14D>

After that, the first phase-inversion element and the second phase-inversion element are activated so that a potential difference of the respective input terminals is amplified. Consequently, a state shown in FIG. 13A can be reproduced.

In the process of discharge, the potential of the input terminal of the first phase-inversion element can be changed more greatly in the memory element of this embodiment than in the memory element in FIGS. 3A and 3B; therefore, an error is less likely to occur in the following process of amplification in the memory element of this embodiment.

For manufacturing the memory element of this embodiment, an additional step is not needed and only change of the layouts of the oxide semiconductor region 308 and the source electrode 307 is needed.

Although a thin film transistor formed with use of a highly purified oxide semiconductor is used as the capacitor switching element 106 and a thin-film capacitor formed with use of a highly purified oxide semiconductor is used as the MIS-type capacitor in the above, a thin film transistor and a thin-film capacitor formed with use of, for example, amorphous silicon, polysilicon, or microcrystalline silicon may be used.

The matter disclosed in this embodiment can be implemented in appropriate combination with the matter described in the other embodiments.

Embodiment 9

In this embodiment, a method for forming an oxide semiconductor film is described with reference to FIGS. 8A and 8B. First, an oxide semiconductor film is formed to have an appropriate thickness over the embedding insulator 314. The oxide semiconductor film can be formed by a sputtering method in a rare gas (typically, argon) atmosphere, an oxygen atmosphere, or an atmosphere including a mixture of a rare gas (for example, argon) and oxygen. For the oxide semiconductor film, the above-described oxide semiconductor can be used.

Note that before the oxide semiconductor film is deposited by a sputtering method, dust on a surface of the embedding insulator 314 is preferably removed by reverse sputtering in which an argon gas is introduced and plasma is generated. The reverse sputtering refers to a method in which, without application of voltage to a target side, an RF power source is used for application of voltage to a substrate side in an argon atmosphere and plasma is generated in the vicinity of the substrate to modify a surface. Note that instead of an argon atmosphere, a nitrogen atmosphere, a helium atmosphere, or the like may be used. Further, an argon atmosphere to which oxygen, nitrous oxide, or the like is added to may be used. Further alternatively, an argon atmosphere to which chlorine, carbon tetrafluoride, or the like is added may be used.

In this embodiment, as the oxide semiconductor film, an In—Ga—Zn-based oxide non-single-crystal film with a thickness of 5 nm, which is obtained by a sputtering method using a metal oxide target containing indium (In), gallium (Ga), and zinc (Zn), is used. As the target, a metal oxide target with such a composition ratio of metal atoms that In:Ga:Zn=1:1:0.5, In:Ga:Zn=1:1:1, or In:Ga:Zn=1:1:2 can be used, for example.

In this embodiment, since crystallization is intentionally caused by performing heat treatment in a later step, it is preferable to use a metal oxide target by which crystallization is easily caused. The fill rate of the metal oxide target containing In, Ga, and Zn is higher than or equal to 90% and lower than or equal to 100%, and preferably higher than or equal to 95% and lower than or equal to 99.9%. When a metal oxide target having a high fill rate is used, the impurity concentration in an oxide semiconductor film to be formed can be low, so that a transistor with excellent electric characteristics or high reliability can be obtained.

The substrate is held in a treatment chamber kept under reduced pressure, a sputtering gas from which hydrogen and moisture are removed is introduced into the treatment chamber from which remaining moisture is being removed, and the oxide semiconductor film is formed over the insulating surface with use of a metal oxide as a target. The substrate temperature may be in the range from 100° C. to 600° C. inclusive, preferably 200° C. to 400° C. inclusive during the film formation. Film formation is performed while the substrate is heated, whereby the concentration of an impurity contained in the formed oxide semiconductor film can be low and crystallinity can be increased. Further, damage by the sputtering can be suppressed.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In a treatment chamber which is exhausted with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the treatment chamber can be low.

An example of the deposition condition is as follows: the distance between the substrate and the target is 170 mm, the pressure is 0.4 Pa, the electric power of the direct current (DC) power source is 0.5 kW, and the atmosphere is an oxygen atmosphere (the proportion of the oxygen flow rate is 100%). Note that a pulsed direct-current (DC) power source is preferable because powder substances (also referred to as particles) generated in film deposition can be reduced and the film thickness can be uniform. The preferable thickness of the oxide semiconductor film is from 1 nm to 30 nm inclusive. Since appropriate thickness depends on an oxide semiconductor material used, the thickness can be determined as appropriate depending on the material.

In order to contain hydrogen, a hydroxyl group, and moisture as little as possible in the oxide semiconductor film, it is preferable that the substrate be preheated in a preheating chamber of a sputtering apparatus as pretreatment before formation of the oxide semiconductor film, so that impurities such as hydrogen or moisture attached on the substrate are discharged and eliminated. The temperature for the preheating is higher than or equal to 100° C. and lower than or equal to 600° C., preferably higher than or equal to 150° C. and lower than or equal to 300° C. As an evacuation unit provided in the preheating chamber, a cryopump is preferable. Note that this preheating treatment can be skipped.

Next, heat treatment is performed and crystals are grown from a surface of the oxide semiconductor film, so that an oxide semiconductor film at least part of which is crystallized or becomes single crystals is obtained. In the heat treatment, a temperature is higher than or equal to 450° C. and lower than or equal to 850° C., preferably higher than or equal to 600° C. and lower than or equal to 700° C. In addition, heating time is longer than or equal to 1 minute and shorter than or equal to 24 hours.

The crystal layer grows from the surface to the inside portion and contains plate-shaped crystals whose average thickness is greater than or equal to 2 nm and less than or equal to 10 nm. Further, the crystal layer formed at the surface has an a-b plane parallel to the surface of the crystal layer and a c-axis alignment perpendicularly to the surface of the crystal layer. In this embodiment, the entire oxide semiconductor film may be crystallized (the crystals are also referred to as co-growing (CG) crystals) by the heat treatment.

Note that in the heat treatment, it is preferable that water, hydrogen, and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N (99.9999%) or more, further preferably 7N (99.99999%) or more (that is, the impurity concentration is 1 ppm or lower, further preferably 0.1 ppm or lower). Further, the heat treatment may be performed in a dry air atmosphere with an $H_2O$ concentration lower than or equal to 20 ppm. In this embodiment, heat treatment in a dry air atmosphere at 700° C. for one hour is performed.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used.

An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, the heat treatment can employ GRTA, in which the substrate is transferred into an inert gas heated at a high temperature of 650° C. to 700° C., and heated for several minutes there, and then taken out from the inert gas. With GRTA, high-temperature heat treatment for a short period of time can be achieved.

Next, the oxide semiconductor region 308 is formed by a photolithography method. Note that a resist mask used in this process may be formed by an inkjet method. Formation of the resist mask by an inkjet method needs no photomask; thus, manufacturing cost can be reduced.

The matter disclosed in this embodiment can be implemented in appropriate combination with the matter described in the other embodiments.

Embodiment 10

Figure 15A:
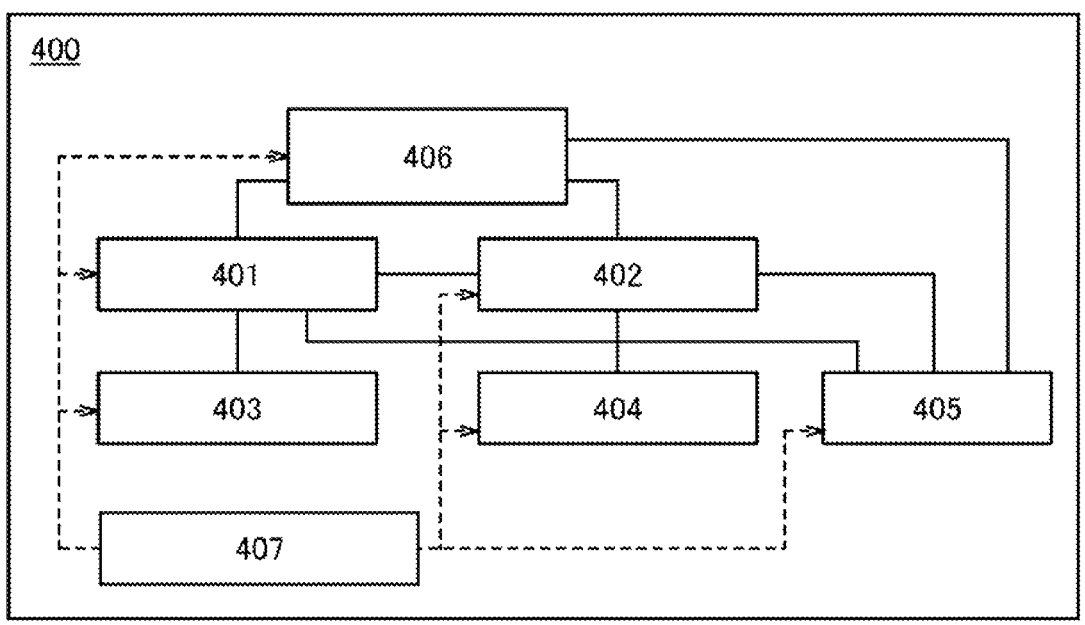
FIG. 15A is a block diagram of a signal processing circuit including a memory device and FIG. 15B is a block diagram of a CPU.

FIG. 15A illustrates an example of a signal processing circuit according to one embodiment of the present invention, in which the memory element described in the above embodiment is used for a memory device. The signal processing circuit according to one embodiment of the present invention at least includes one or a plurality of arithmetic units and one or a plurality of memory devices. Specifically, a signal processing circuit 400 in FIG. 15A includes an arithmetic circuit 401, an arithmetic circuit 402, a memory device 403, a memory device 404, a memory device 405, a control device 406, and a power supply control circuit 407.

The arithmetic circuits 401 and 402 each include, as well as a logic circuit which carries out simple logic arithmetic processing, an adder, a multiplier, and various arithmetic units. The memory device 403 functions as a register for temporarily holding data when the arithmetic processing is carried out in the arithmetic circuit 401. The memory device 404 functions as a register for temporarily holding data when the arithmetic processing is carried out in the arithmetic circuit 402.

In addition, the memory device 405 can be used as a main memory and can store a program executed by the control device 406 as data or can store data from the arithmetic circuit 401 and the arithmetic circuit 402.

The control device 406 is a circuit which collectively controls operations of the arithmetic circuit 401, the arithmetic circuit 402, the memory device 403, the memory device 404, and the memory device 405 included in the signal processing circuit 400. Note that in FIG. 15B, a structure in which the control device 406 is provided in the signal processing circuit 400 as a part thereof is illustrated, but the control device 406 may be provided outside the signal processing circuit 400.

In the case where the memory element described in the above embodiment is used for at least one of the memory device 403, the memory device 404, and the memory device 405, data can be held even when supply of power supply voltage to the memory device 403, the memory device 404, and the memory device 405 is partly or completely stopped. In the above manner, the supply of the power supply voltage to the entire signal processing circuit 400 can be stopped partly or completely, whereby power consumption can be suppressed.

For example, the supply of the power supply voltage to one or more of the memory device 403, the memory device 404, and the memory device 405 is stopped, whereby power consumption can be suppressed. Alternatively, for example, in FIGS. 1A and 1B, supply of VH or VL to the memory element 100 is stopped and the signal Sig. 3 is set to the certain artificial potential (that is a potential lower than the ground potential by 0.5 V to 1.5 V), which is effective in reducing the power consumption.

When the signal Sig. 3 is set to the above potential, some current is considered to flow between the gate electrode and the oxide semiconductor region in the capacitor switching element 106; however, the value of the current is too small to be measured. That is, the current does not lead to power consumption. In contrast, when VH or VL is supplied to the memory element 100, the through current of the inverter is generated, and the considerable amount of power is accordingly consumed. Thus, stop of the supplying VH and VL produces a great effect of lowering power consumption.

Note that, as well as the supply of the power supply voltage to the memory device, the supply of the power supply voltage to the control circuit or the arithmetic circuit which transmits/receives data to/from the memory device may be stopped. For example, when the arithmetic circuit 401 and the memory device 403 are not operated, the supply of the power supply voltage to the arithmetic circuit 401 and the memory device 403 may be stopped.

In addition, the power supply control circuit 407 controls the level of the power supply voltage which is supplied to the arithmetic circuit 401, the arithmetic circuit 402, the memory device 403, the memory device 404, the memory device 405, and the control device 406 included in the signal processing circuit 400. As described above, the power supply control circuit controls VDD, VSS, and a potential of signal Sig. 3 as needed, and thus, consumed power can be reduced in a most effectively manner.

When the supply of the power supply voltage is stopped, the supply of the power supply voltage to the power supply control circuit 407 may be stopped, or the supply of the power supply voltage to the arithmetic circuit 401, the arithmetic circuit 402, the memory device 403, the memory device 404, the memory device 405, and the control device 406 may be stopped.

That is, a switching element for stopping the supply of the power supply voltage may be provided for the power supply control circuit 407, or each of the arithmetic circuit 401, the arithmetic circuit 402, the memory device 403, the memory device 404, the memory device 405, and the control device 406. In the latter case, the power supply control circuit 407 is not necessarily provided in the signal processing circuit according to the present invention.

A memory device which functions as a cache memory may be provided between the memory device 405 that is a main memory and each of the arithmetic circuit 401, the arithmetic circuit 402, and the control device 406. By providing the cache memory, low-speed access to the main memory can be reduced and the speed of the signal processing such as arithmetic processing can be higher. By applying the above-described memory element also to the memory device functioning as a cache memory, power consumption of the signal processing circuit 400 can be suppressed.

Embodiment 11

In this embodiment, a configuration of a CPU, which is one of signal processing circuits according to one embodiment of the present invention, will be described.

Figure 15B:
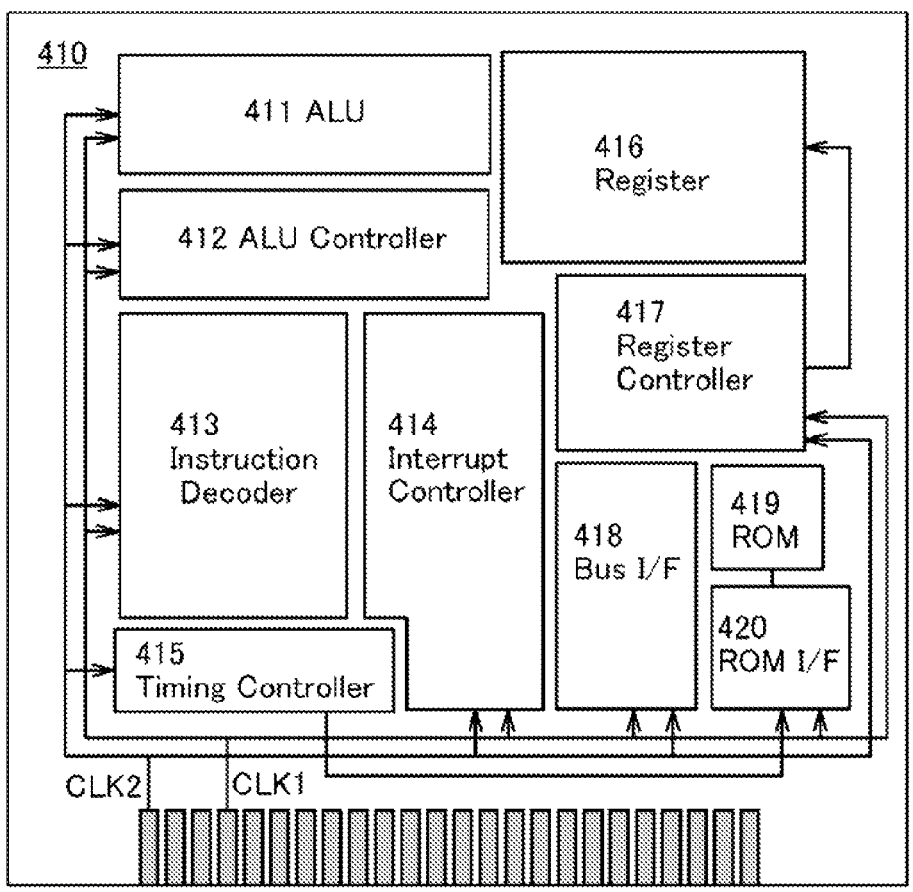

FIG. 15B illustrates a configuration of a CPU in this embodiment. The CPU illustrated in FIG. 15B mainly includes an arithmetic logic unit (ALU) 411, an ALU controller 412, an instruction decoder 413, an interrupt controller 414, a timing controller 415, a register 416, a register controller 417, a bus interface (Bus I/F) 418, a rewritable ROM 419, and a ROM interface (ROM I/F) 420, over a substrate 410. The ROM 419 and the ROM interface 420 may be provided over another chip. Naturally, the CPU illustrated in FIG. 15B is only an example with a simplified configuration, and various configurations can be applied to an actual CPU depending on the application.

An instruction input to the CPU via the Bus I/F 418 is input to the instruction decoder 413 and decoded therein, and then input to the ALU controller 412, the interrupt controller 414, the register controller 417, and the timing controller 415.

In accordance with the decoded instruction, the ALU controller 412, the interrupt controller 414, the register controller 417, and the timing controller 415 conduct various controls. Specifically, the ALU controller 412 generates a signal for controlling operation of the ALU 411.

While the CPU is executing a program, the interrupt controller 414 judges an interrupt request from an external input/output device or a peripheral circuit on the basis of its priority or a mask state, and processes the request. The register controller 417 generates an address of the register 416 and reads/writes data from/to the register 416 in accordance with the state of the CPU.

Further, the timing controller 415 generates a signal for controlling a timing of operation of the ALU 411, the ALU controller 412, the instruction decoder 413, the interrupt controller 414, and the register controller 417. For example, the timing controller 415 includes an internal clock generator for generating an internal clock signal CLK2 based on a reference clock signal CLK1, and supplies the clock signal CLK2 to the above circuits.

In the CPU in this embodiment, the register 416 may include a memory element with the above structure described in the above embodiment. The register controller 417 selects operation of holding data in the register 416 in accordance with the ALU 411.

That is, the register controller 417 determines whether data is held by a phase-inversion element or by a capacitor in the memory element included in the register 416. When data holding by the phase-inversion element is selected, power supply voltage is supplied to the memory element in the register 416. When data holding by the capacitor is selected, the data is rewritten in the capacitor, and supply of power supply voltage to the memory element in the register 416 can be stopped.

In such a manner, even in the case where the operation of the CPU is temporarily stopped and the supply of the power supply voltage is stopped, data can be held and the consumed power can be reduced. Specifically, for example, while a user of a personal computer does not input data to an input device such as a keyboard, the operation of the CPU can be stopped, so that the consumed power can be reduced.

Although the CPU is given as an example in this embodiment, the signal processing circuit of the present invention, without limitation to the CPU, can be applied to an LSI such as a DSP, a custom LSI, or a field programmable gate array (FPGA). With use of a signal processing circuit described in the present invention, a highly reliable electronic device and an electronic device with low power consumption can be provided.

In particular, when to a portable electronic device which has difficulty in continuously receiving power from an external device, a signal processing circuit with low power consumption according to one embodiment of the present invention is added as a component of the device, an advantage in increasing the continuous operation time can be obtained.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images).

Other than the above, as an electronic device which can be provided with the signal processing circuit according to one embodiment of the present invention, mobile phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

This application is based on Japanese Patent Application serial no. 2011-088815 filed with Japan Patent Office on Apr. 13, 2011, the entire contents of which are hereby incorporated by reference.

What is claimed is:

1. A memory device comprising:
a pair of inverters, wherein an output terminal of one of the phase inversion elements inverters is connected to an input terminal of the other of the inverters, wherein the pair of inverters is configured to hold data when power is supplied;
a capacitor;
a first transistor between the output terminal of the one of the inverters and a terminal, wherein the first transistor is configured to transmit the data between the terminal and the pair of inverters;
a second transistor provided above at least one of the inverters, wherein the second transistor is configured to control a flow of charges between the output terminal of the one of the inverters and the capacitor; and
a circuit, wherein the circuit is configured to set the output terminal of the one of the inverters and an output terminal of the other of the inverters to a first potential.

2. The memory device according to claim 1, wherein the capacitor is provided over at least one of the inverters.

3. The memory device according to claim 1, wherein any one of the inverters is or a clocked inverter.

4. The memory device according to claim 1, wherein the second transistor includes an In—Ga—Zn-based oxide semiconductor.

5. The memory device according to claim 1, wherein a hydrogen concentration of a channel formation region of the second transistor is less than or equal to $5\times10^{19}/cm^3$.

6. A memory device comprising:
a pair of inverters, wherein an output terminal of one of the inverters is connected to an input terminal of the other of the inverters, wherein the pair of inverters is configured to hold data when power of supplied;
a capacitor;
a first switching element provided above at least one of the inverters, wherein the first switching element is configured to control a flow of charges between the output terminal of the one of the inverters and the capacitor;
a second switching element between input terminals of the pair of inverters; and
a circuit, wherein the circuit is configured to supply a first potential to the input terminal of the one of the inverters.

7. The memory device according to claim 6, wherein the capacitor is provided over at least one of the inverters.

8. The memory device according to claim 6, wherein any one of the inverters is a clocked inverter.

9. The memory device according to claim 6, wherein the first switching element comprises a transistor, and
wherein the transistor includes an In—Ga—Zn-based oxide semiconductor.

10. The memory device according to claim 6, wherein the first switching element comprises a transistor, and
wherein a hydrogen concentration of a channel formation region of the transistor is less than or equal to $5\times10^{19}/cm^3$.

11. A memory device comprising:
a memory element comprising:
a pair of inverters, wherein an output terminal of one of the inverters is connected to an input terminal of the other of the inverters, wherein the pair of inverters is configured to hold data when power is supplied;
a capacitor; and
a first switching element provided above at least one of the inverters, wherein the first switching element is configured to controls a flow of charges between the output terminal of the one of the inverters and the capacitor; and
a second switching element connected to an output terminal of the memory element, wherein the second switching element is configured to control the potential of the output terminal of the memory element.

12. The memory device according to claim 11, wherein the capacitor is provided over at least one of the inverters.

13. The memory device according to claim 11, wherein any one of the inverters is a clocked inverter.

14. The memory device according to claim 11, wherein the first switching element comprises a transistor, and
wherein the transistor includes an In—Ga—Zn-based oxide semiconductor.

15. The memory device according to claim 11, wherein the first switching element comprises a transistor, and
wherein a hydrogen concentration of a channel formation region of the transistor is less than or equal to $5\times10^{19}/cm^3$.

16. A method for driving the memory device according to claim 1, comprising the steps of:
- holding charges in accordance with the data, in the capacitor;
- stopping power supply to the pair of inverters;
- supplying a first potential to an input terminal and an output terminal of the pair of inverters;
- turning the second transistor on; and
- supplying power to the pair of inverters.

17. A method for driving the memory device according to claim 6, comprising the steps of:
- holding charges in accordance with the data, in the capacitor;
- stopping power supply to the pair of inverters;
- supplying a first potential to an input terminal and an output terminal of the pair of inverters;
- turning the first switching element on; and
- supplying power to the pair of inverters.

18. A method for driving the memory device according to claim 11, comprising the steps of:
- holding charges in accordance with the data, in the capacitor;
- stopping power supply to the pair of inverters;
- supplying a first potential to an input terminal and an output terminal of the pair of inverters at a certain potential;
- turning the first switching element on; and
- supplying power to the inverters.

19. A method for driving the memory device according to claim 6, comprising the steps of:
- holding charges in accordance with the data, in the capacitor;
- stopping power supply to the pair of inverters;
- turning the second switching element on;
- supplying a first potential to the input terminal of the other of the inverters;
- turning the second switching element off;
- turning the first switching element on; and
- supplying power to the pair of inverters.

20. A method for driving the memory device according to claim 11, comprising the steps of:
- holding charges in accordance with the data, in the capacitor;
- stopping power supply to the pair of inverters;
- turning the second switching element on;
- supplying a first potential to the input terminal of the other the inverters;
- turning the second switching element off;
- turning the first switching element on; and
- supplying power to the pair of inverters.

* * * * *

UNITED STATES PATENT AND TRADEMARK OFFICE
CERTIFICATE OF CORRECTION

| | | |
|---|---|---|
| PATENT NO. | : 8,854,867 B2 | Page 1 of 1 |
| APPLICATION NO. | : 13/442113 | |
| DATED | : October 7, 2014 | |
| INVENTOR(S) | : Yasuhiko Takemura | |

It is certified that error appears in the above-identified patent and that said Letters Patent is hereby corrected as shown below:

In the specification,

Column 15, line 3, replace both instances of "N" with --IN--;

Column 16, line 35, replace "N" with --IN--;

Column 16, line 39, replace "N" with --IN--;

Column 25, line 30, after "thereof" insert --.--;

Column 26, line 43, replace "N" with --IN--;

Column 26, line 47, replace "N" with --IN--;

Column 42, line 29, delete "(" before --I/F)--;

In the claims,

Column 43, line 52, Claim 1, after "one of the" delete "phase inversion elements"; and Column 44, line 4, Claim 3, after "the inverters is" delete "or".

Signed and Sealed this
Twenty-seventh Day of October, 2015

Michelle K. Lee
*Director of the United States Patent and Trademark Office*